United States Patent
Tebbens et al.

(10) Patent No.: US 11,681,296 B2
(45) Date of Patent: Jun. 20, 2023

(54) SCENARIO-BASED BEHAVIOR SPECIFICATION AND VALIDATION

(71) Applicant: Motional AD LLC, Boston, MA (US)

(72) Inventors: Radboud Duintjer Tebbens, Winchester, MA (US); Anne Collin, Cambridge, MA (US); Calin Belta, Sherborn, MA (US); Emilio Frazzoli, Newton, MA (US); Kostyantyn Slutskyy, Singapore (SG); Amitai Bin-Nun, Silver Spring, MD (US); Tichakorn Wongpiromsarn, Ames, IA (US); Hsun-Hsien Chang, Brookline, MA (US)

(73) Assignee: Motional AD LLC, Boston, MA (US)

( * ) Notice: Subject to any disclaimer, the term of this patent is extended or adjusted under 35 U.S.C. 154(b) by 241 days.

(21) Appl. No.: 17/120,064

(22) Filed: Dec. 11, 2020

(65) Prior Publication Data

US 2022/0187837 A1    Jun. 16, 2022

(51) Int. Cl.
  *G05D 1/02* (2020.01)
  *G06F 16/22* (2019.01)
  (Continued)

(52) U.S. Cl.
  CPC ......... *G05D 1/0221* (2013.01); *B60W 50/045* (2013.01); *B60W 50/14* (2013.01);
  (Continued)

(58) Field of Classification Search
  CPC .................................................. G05D 1/0221
  See application file for complete search history.

(56) References Cited

U.S. PATENT DOCUMENTS 10,883,844 B2 * 1/2021 Ogale ...................... G06N 3/08
11,203,362 B1 * 12/2021 Beijbom ............ B60W 60/0011
(Continued)

FOREIGN PATENT DOCUMENTS

| JP | 2018-181209 | 11/2018 |
|---|---|---|
| KR | 10-2012230 | 8/2019 |
| KR | 10-2158497 | 9/2020 |

OTHER PUBLICATIONS

[No Author Listed], "SAE: Surface Vehicle Recommended Practice; Taxonomy and Definitions for Terms Related to Driving Automation Systems for On-Road Motor Vehicles," J3016, Sep. 30, 2016, 30 pages.

*Primary Examiner* — Michael A Berns
(74) *Attorney, Agent, or Firm* — Fish & Richardson P.C.

(57) ABSTRACT

Enclosed are embodiments for scenario-based behavior specification and validation. In an embodiment, a method comprises: obtaining, using at least one processor, at least one trajectory associated with a driving scenario for an autonomous vehicle system; evaluating, using the at least one processor and at least one rulebook, the at least one trajectories to determine whether the at least one trajectory violates at least one rule in the at least one rulebook, wherein each rule in the rulebook is associated with at least one violation metric that is used to determine a degree to which the rule was satisfied or violated; determining, using the at least one processor and the at least one violation metric, a score for the at least one trajectory; and sending, using the at least one processor, the score to at least one of a software module in a software stack of the autonomous vehicle system, a simulation of the autonomous vehicle system or as a report or in a visual presented through a user interface of a cloud-based platform.

19 Claims, 18 Drawing Sheets

(51) Int. Cl.
*B60W 60/00* (2020.01)
*B60W 50/04* (2006.01)
*B60W 50/14* (2020.01)
*G06F 30/20* (2020.01)
*B60W 50/00* (2006.01)

(52) U.S. Cl.
CPC ..... *B60W 60/0013* (2020.02); *G06F 16/2246* (2019.01); *B60W 2050/0026* (2013.01); *B60W 2050/146* (2013.01); *B60W 2540/215* (2020.02); *G06F 30/20* (2020.01)

(56) References Cited

U.S. PATENT DOCUMENTS

| | | | |
|---|---|---|---|
| 11,231,717 B2 * | 1/2022 | Fan | G05D 1/0088 |
| 2017/0285585 A1 * | 10/2017 | Weast | B60W 30/09 |
| 2019/0033085 A1 | 1/2019 | Ogale et al. | |
| 2019/0286151 A1 * | 9/2019 | Palanisamy | G08G 1/096816 |
| 2020/0150671 A1 | 5/2020 | Fan et al. | |
| 2022/0176995 A1 * | 6/2022 | Subramanian | G05D 1/0214 |

\* cited by examiner

SCENARIO CONFIGURATION

```
{
    "drivable_area": "drivable_area/onenorth.json",
    "rulebook" : "rulebooks/singapore.json",
    "checks" : {
        "drivability: {
            "distance_to_undrivability": 0.0
        },
        "curvature_bound": {
            "max_curvature": 0.2
        },
        "inflection_point" : {
            "max_inflection_points": 0,
            "curvature_epsilon": 0.005
        },
        "clearance": {
            "min_clearance": 1.0
        },
        "speed_bound": {
            "min_speed": 0.0,
            "max_speed": 10.0
        },
        "speed_extrema":
            "max_speed_extrema": 0,
            "speed_change_epsilon": 0.05
        }
    }
}
```

TRAJECTORY

```
{"trajectory": {
    {
        "timestamp": 1541578445643519,
        "vehicles": {
            {
                "footprint": {
                    [668.1581916049573, 981.1068130134256],
                    [672.2692956394473, 979.2871154488312],
                    [672.9978500044352, 980.933002804904],
                    [668.8867459699453, 982.7527803694984]
                },
                "pose": [670.5780208046963, 981.0199479091648, 2.724884582728026],
                "speed": 6.3003269388288681,
                "accel": [0, 0]
            },
            {
                "footprint": {
                    [714.2100116677149, 958.2811674679053],
                    [719.5327951172384, 954.5159112709803],
                    [721.0950626834027, 956.7244228595671],
                    [715.7722792338792, 960.4896799564922]
                },
                "pose": [717.6525371755588, 957.5024951637362, 2.5259276119343763],
                "speed": 0.0,
                "accel": [0, 0]
            }
        },
        "bicyclists": [ ],
        "pedestrians": [ ],
        "av": {
            "footprint": {
                [655.5457243161856, 986.43989960919],
                [659.2945822125724, 984.8196682563329],
                [660.0662111244986, 986.6050572397982],
                [656.3173532281118, 988.2252795926553]
            },
            "pose": [657.8059677203421, 986.5224739244941, 2.7336470304975915],
            "speed": 6.877253574378266,
            "accel": [0.8304455612999485, -0.1863687974550137]
        }
    },
    {
        "timestamp": 1541578445664180,
        "vehicles": {
```

SCENARIO-BASED BEHAVIOR SPECIFICATION AND VALIDATION

FIELD OF THE INVENTION

The description that follows relates generally to tools for validating the behavior of an autonomous vehicle under different driving scenarios.

BACKGROUND

Autonomous vehicles use a planner in their software stacks to generate candidate trajectories for the autonomous vehicle under various scenarios. The planner uses sensor data and the vehicle's physical state (e.g., position, speed, heading) to generate possible trajectories for the vehicle to avoid collision with agents (e.g., other vehicles, pedestrians) in the vicinity of the autonomous vehicle. The planner typically takes into consideration the violation of traffic laws and possibly other driving rules (e.g., safety, ethics, local culture, passenger comfort, courtesy, performance, etc.) when determining which candidate trajectory the vehicle should take for a given driving scenario. Accordingly, it is desirable to evaluate planned trajectories under a large variety of driving scenarios that may occur in the real-world.

Validating the behavior of an autonomous vehicle in a driving scenario is difficult when there is not a good understanding of the expected behavior. The expected behavior depends on driving rules and their priority structure, which in the event that some rules need to be violated governs which rule should be violated first. For example, when there is an illegally parked car near a double solid lane marking, a vehicle will have to overtake it but it will either have to violate a rule of not crossing a double solid line or a rule that ensures a lateral distance between the vehicle and the parked car (e.g., in case a door opens). It is desirable to avoid trajectories that violate rules by filtering out those candidate trajectories for the driving scenario.

SUMMARY

Techniques are provided for scenario-based behavior specification and validation. In an embodiment, a method comprises: obtaining, using at least one processor, at least one trajectory associated with a driving scenario for an autonomous vehicle system; evaluating, using the at least one processor and at least one rulebook, the at least one trajectories to determine whether the at least one trajectory violates at least one rule in the at least one rulebook, wherein each rule in the rulebook is associated with at least one violation metric that is used to determine a degree to which the rule was satisfied or violated; determining, using the at least one processor and the at least one violation metric, a score for the at least one trajectory; and sending, using the at least one processor, the score to at least one of a software module in a software stack of the autonomous vehicle system, a simulation of the autonomous vehicle system or as a report or in a visual presented through a user interface of a cloud-based platform.

In an embodiment, the method further comprises: dividing, using the at least one processor, the at least one trajectory into a plurality of time intervals; evaluating, using the at least one processor and the at least one rulebook, a portion of the at least one trajectory for the time interval to determine whether or by how much the portion violates at least one rule in the at least one rulebook; and aggregating, using the at least one processor, at least one value of the at least one violation metric for each time interval to generate an aggregated violation metric value based on determining that the portion violates the at least one rule in the at least one rulebook.

In an embodiment, the method further determines the score for the at least one trajectory based on the aggregated violation metric value.

In an embodiment, the at least one rulebook is a data structure implementing a pre-ordered set of rules that are arranged in a hierarchy based on their relative importance.

In an embodiment, there are at least two trajectories, and at least one trajectory of the two is evaluated using at least one rulebook.

In an embodiment, at least one of the trajectories is a reference trajectory against which another trajectory can be compared.

In an embodiment, a rule-based trajectory evaluation system comprises: a user interface configured for receiving user input selecting at least a driving scenario; at least one processor; and a memory storing instructions thereon that, when executed by the at least one processor, cause the at least one processor to: evaluate, using at least one rulebook, at least one trajectory in the at least one driving scenario to determine whether the at least one trajectory violates at least one rule in the at least one rulebook, wherein each rule in the rulebook is associated with at least one violation metric that is used to determine a degree to which the rule was satisfied or violated; determine, using the at least one metric, a score for the at least one trajectory; generate a report or visual related to the score; and provide data associated with the report, the data associated with the report configured to cause the user interface to present the report via the user interface.

In an embodiment, the instructions further cause the at least one processor to: divide the at least one trajectory into a plurality of time intervals; and wherein the instructions that cause the at least one processor to evaluate the at least one trajectory further cause the at least one processor to: evaluate, using the at least one rulebook, a portion of the at least one trajectory for the time interval to determine a degree to which the portion violates at least one rule in the at least one rulebook; aggregate at least one value of the at least one violation metric for each time interval; determine, using the aggregated metrics, a score for the at least one trajectory.

In an embodiment, the system further comprises: a database storing the at least one rulebook as a data structure implementing a structured formulation of rules that are arranged in a hierarchy based on their relative importance.

In an embodiment, a non-transient, computer-readable storage medium has stored thereon instructions, that when executed by at least one processor, cause the at least one processor any of the methods described above.

One or more of the disclosed embodiments provide one or more of the following advantages. A rule-based trajectory evaluation system takes as inputs one or more maps, perception outputs (e.g., current agents on the road) and one or more planned trajectories, and outputs scores for the one or more planned trajectories. The trajectory scores are based on structured formalizations of individual rules to help establish behavior specifications for autonomous vehicles on a per scenario basis. The evaluation system can be used to evaluate the planner, in which case perception outputs are used to evaluate the entire AV and/or to evaluate the AV, in which case the ground truth of the scenario (with all actual agent positions) is used.

The scores can be fed back to various users, including but not limited to software modules of an autonomous vehicle software stack (e.g., planner, controller, predictor, simulator, etc.) that can call the rule-based trajectory evaluation system. The rule-based trajectory evaluation system can also be implemented on a cloud platform, for simulation, validation and verification, and research purposes, or in a vehicle for real-time planned trajectory evaluation. For example, the behavior specification and validators used in the rule-based evaluation system can be integrated into a software simulation for autonomous vehicles for automated verification of an ego vehicle's behavior in a given scenario and to generate regressions.

These and other aspects, features, and implementations can be expressed as methods, apparatus, systems, components, program products, means or steps for performing a function, and in other ways. These and other aspects, features, and implementations will become apparent from the following descriptions, including the claims.

BRIEF DESCRIPTION OF THE DRAWINGS

FIGS. 13A and 13B illustrate example scenario configuration and trajectory data structures, respectively, in accordance with one or more embodiments.

DETAILED DESCRIPTION

Figure 1:
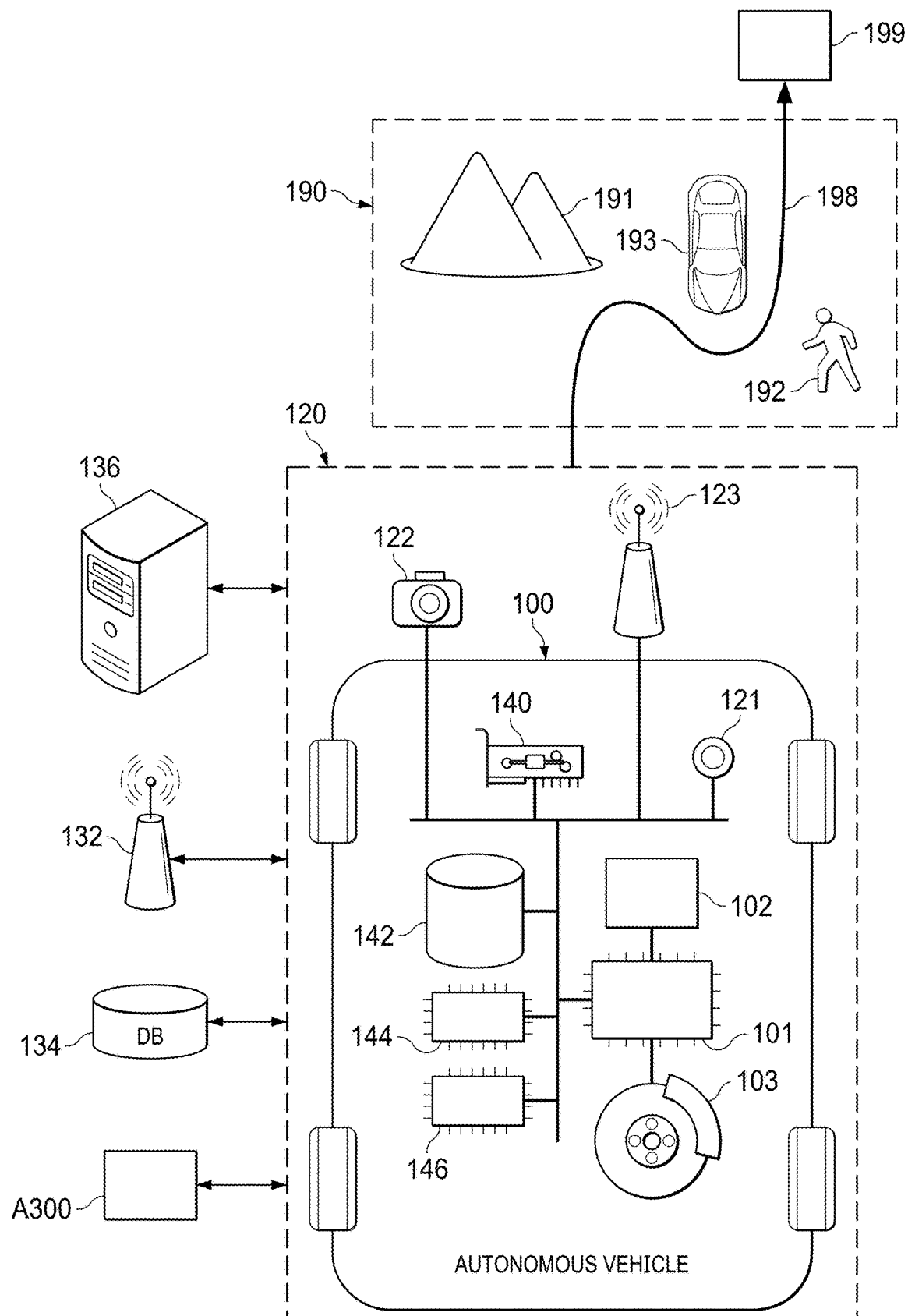
FIG. 1 shows an example of an autonomous vehicle (AV) having autonomous capability, in accordance with one or more embodiments.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

In the drawings, specific arrangements or orderings of schematic elements, such as those representing devices, modules, instruction blocks and data elements, are shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

Further, in the drawings, where connecting elements, such as solid or dashed lines or arrows, are used to illustrate a connection, relationship, or association between or among two or more other schematic elements, the absence of any such connecting elements is not meant to imply that no connection, relationship, or association can exist. In other words, some connections, relationships, or associations between elements are not shown in the drawings so as not to obscure the disclosure. In addition, for ease of illustration, a single connecting element is used to represent multiple connections, relationships or associations between elements. For example, where a connecting element represents a communication of signals, data, or instructions, it should be understood by those skilled in the art that such element represents one or multiple signal paths (e.g., a bus), as may be needed, to affect the communication.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Several features are described hereafter that can each be used independently of one another or with any combination of other features. However, any individual feature may not address any of the problems discussed above or might only address one of the problems discussed above. Some of the problems discussed above might not be fully addressed by any of the features described herein. Although headings are provided, information related to a particular heading, but not found in the section having that heading, may also be found elsewhere in this description. Embodiments are described herein according to the following outline:

1. General Overview
2. System Overview
3. Autonomous Vehicle Architecture
4. Scenario-Based Behavior Specification and Validation General Overview Techniques are provided for scenario-based behavior specification and validation. Given a trajectory, a rule-based trajectory evaluation system analyzes input data (e.g., one or more maps, perception outputs, trajectories) in three steps: tailoring, reduction and aggregation. The tailoring step includes dividing the trajectory into time intervals, where the simplest interval can be between two consecutive timestamps. In some embodiments, the interval can be longer to cover multiple timestamps. In an embodiment, the entire directory is considered as a single interval.

The reduction step associates each interval with a violation metric used to evaluate the trajectory. In an embodiment, a signal temporal logic (STL) framework is used to specify driving rules and an arithmetic-geometric mean (AGM) framework is used to score (measure the robustness of) trajectories. The STL framework uses qualitative and quantitative semantics to assess whether and how well a trajectory follows rules in a rulebook. The AGM framework uses arithmetic and geometric means to account for degrees of robustness, such that trajectories that satisfy rules at more timesteps receive higher scores.

In other embodiments, other methods can be used to express system behavior under complex temporal requirements, including but not limited to: linear temporal logic (LTL), metric temporal logic (MTL), and time window temporal logic (TWTL). Also, other embodiments can use different scoring methods, including but not limited to: p-norms, heuristic optimization approaches (e.g., particle swarm optimization, simulated annealing, rapidly exploring random trees (RRTs)) and mixed integer linear programming (MILP).

The aggregation step aggregates all the violation metrics of intervals to summarize a single score for the entire trajectory. In an embodiment, the reduction and aggregation steps are integrated into a single step. If the tailoring step is not performed, the reduction and aggregation steps are degenerated into a single step.

In an embodiment, output scores are fed back to users, which may include software modules (e.g., planner, controller, predictor, simulator). In other embodiments, the system is hosted on a cloud platform for simulation and research purposes, or in a vehicle for real-time trajectory evaluation.

By virtue of the implementation of the systems and methods described herein, trajectories may be more accurately scored. As a result, systems described herein (e.g., planning systems) may select trajectories that satisfy one or more rules and/or forego selection of trajectories that do not satisfy the one or more rules when programming (e.g., training) one or more systems of an autonomous vehicle architecture. This, in turn, may result in better and more predictable operation of vehicles including such an autonomous vehicle architecture.

System Overview

FIG. 1 shows an example of an autonomous vehicle 100 having autonomous capability.

As used herein, the term "autonomous capability" refers to a function, feature, or facility that enables a vehicle to be partially or fully operated without real-time human intervention, including without limitation fully autonomous vehicles, highly autonomous vehicles, and conditionally autonomous vehicles.

As used herein, an autonomous vehicle (AV) is a vehicle that possesses autonomous capability.

As used herein, "vehicle" includes means of transportation of goods or people. For example, cars, buses, trains, airplanes, drones, trucks, boats, ships, submersibles, dirigibles, motorcycles, bicycles, etc. A driverless car is an example of a vehicle.

As used herein, "trajectory" refers to a path or route to operate an AV from a first spatiotemporal location to second spatiotemporal location. In an embodiment, the first spatiotemporal location is referred to as the initial or starting location and the second spatiotemporal location is referred to as the destination, final location, goal, goal position, or goal location. In some examples, a trajectory is made up of one or more segments (e.g., sections of road) and each segment is made up of one or more blocks (e.g., portions of a lane or intersection). In an embodiment, the spatiotemporal locations correspond to real world locations. For example, the spatiotemporal locations are pick up or drop-off locations to pick up or drop-off persons or goods.

As used herein, "sensor(s)" includes one or more hardware components that detect information about the environment surrounding the sensor. Some of the hardware components can include sensing components (e.g., image sensors, biometric sensors), transmitting and/or receiving components (e.g., laser or radio frequency wave transmitters and receivers), electronic components such as analog-to-digital converters, a data storage device (such as a RAM and/or a nonvolatile storage), software or firmware components and data processing components such as an ASIC (application-specific integrated circuit), a microprocessor and/or a microcontroller.

As used herein, a "road" is a physical area that can be traversed by a vehicle, and may correspond to a named thoroughfare (e.g., city street, interstate freeway, etc.) or may correspond to an unnamed thoroughfare (e.g., a driveway in a house or office building, a section of a parking lot, a section of a vacant lot, a dirt path in a rural area, etc.). Because some vehicles (e.g., 4-wheel-drive pickup trucks, sport utility vehicles, etc.) are capable of traversing a variety of physical areas not specifically adapted for vehicle travel, a "road" may be a physical area not formally defined as a thoroughfare by any municipality or other governmental or administrative body.

As used herein, a "lane" is a portion of a road that can be traversed by a vehicle and may correspond to most or all of the space between lane markings, or may correspond to only some (e.g., less than 50%) of the space between lane markings. For example, a road having lane markings spaced far apart might accommodate two or more vehicles between the markings, such that one vehicle can pass the other without traversing the lane markings, and thus could be interpreted as having a lane narrower than the space between the lane markings or having two lanes between the lane markings. A lane could also be interpreted in the absence of lane markings. For example, a lane may be defined based on physical features of an environment, e.g., rocks and trees along a thoroughfare in a rural area.

As used herein, a "rulebook" is a data structure implementing a priority structure on a set of rules that are arranged based on their relative importance, where for any particular rule in the priority structure, the rule(s) having lower priority in the structure than the particular rule in the priority structure have lower importance than the particular rule. Possible priority structures include but are not limited to: hierarchical structures (e.g., total order or pre-order on different degrees of rule violations), non-hierarchical structures (e.g., a weighting system on the rules) or a hybrid priority structure in which subsets of rules are hierarchical but rules within each subset are non-hierarchical. Rules can include traffic laws, safety rules, ethical rules, local culture rules, passenger comfort rules and any other rules that could be used to evaluate a trajectory of a vehicle provided by any source (e.g., humans, text, regulations, websites).

As used herein, "ego vehicle" or "ego" refers to a virtual vehicle or AV with virtual sensors for sensing a virtual environment that is utilized by, for example, a planner to plan the route of the virtual AV in the virtual environment.

"One or more" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "includes," and/or "including," when used in this description, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

As used herein, an AV system refers to the AV along with the array of hardware, software, stored data, and data generated in real-time that supports the operation of the AV. In an embodiment, the AV system is incorporated within the AV. In an embodiment, the AV system is spread across several locations. For example, some of the software of the AV system is implemented on a cloud computing environment similar to cloud computing environment 300 described below with respect to FIG. 3.

In general, this document describes technologies applicable to any vehicles that have one or more autonomous capabilities including fully autonomous vehicles, highly autonomous vehicles, and conditionally autonomous vehicles, such as so-called Level 5, Level 4 and Level 3 vehicles, respectively (see SAE International's standard J3016: Taxonomy and Definitions for Terms Related to On-Road Motor Vehicle Automated Driving Systems, which is incorporated by reference in its entirety, for more details on the classification of levels of autonomy in vehicles). The technologies described in this document are also applicable to partially autonomous vehicles and driver assisted vehicles, such as so-called Level 2 and Level 1 vehicles (see SAE International's standard J3016: Taxonomy and Definitions for Terms Related to On-Road Motor Vehicle Automated Driving Systems). In an embodiment, one or more of the Level 1, 2, 3, 4 and 5 vehicle systems may automate certain vehicle operations (e.g., steering, braking, and using maps) under certain operating conditions based on processing of sensor inputs. The technologies described in this document can benefit vehicles in any levels, ranging from fully autonomous vehicles to human-operated vehicles.

Referring to FIG. 1, an AV system 120 operates the AV 100 along a trajectory 198 through an environment 190 to a destination 199 (sometimes referred to as a final location) while avoiding objects (e.g., natural obstructions 191, vehicles 193, pedestrians 192, cyclists, and other obstacles) and obeying rules of the road (e.g., rules of operation or driving preferences).

In an embodiment, the AV system 120 includes devices 101 that are instrumented to receive and act on operational commands from the computer processors 146. In an embodiment, computing processors 146 are similar to the processor 304 described below in reference to FIG. 3. Examples of devices 101 include a steering control 102, brakes 103, gears, accelerator pedal or other acceleration control mechanisms, windshield wipers, side-door locks, window controls, and turn-indicators.

In an embodiment, the AV system 120 includes sensors 121 for measuring or inferring properties of state or condition of the AV 100, such as the AV's position, linear velocity and acceleration, angular velocity and acceleration, and heading (e.g., an orientation of the leading end of AV 100). Example of sensors 121 are a Global Navigation Satellite System (GNSS) receiver, inertial measurement units (IMU) that measure both vehicle linear accelerations and angular rates, wheel speed sensors for measuring or estimating wheel slip ratios, wheel brake pressure or braking torque sensors, engine torque or wheel torque sensors, and steering angle and angular rate sensors.

In an embodiment, the sensors 121 also include sensors for sensing or measuring properties of the AV's environment. For example, monocular or stereo video cameras 122 in the visible light, infrared or thermal (or both) spectra, LiDAR 123, RADAR, ultrasonic sensors, time-of-flight (TOF) depth sensors, speed sensors, temperature sensors, humidity sensors, and precipitation sensors.

In an embodiment, the AV system 120 includes a data storage unit 142 and memory 144 for storing machine instructions associated with computer processors 146 or data collected by sensors 121. In an embodiment, the data storage unit 142 is similar to the ROM 308 or storage device 310 described below in relation to FIG. 3. In an embodiment, memory 144 is similar to the main memory 306 described below. In an embodiment, the data storage unit 142 and memory 144 store historical, real-time, and/or predictive information about the environment 190. In an embodiment, the stored information includes maps, driving performance, traffic congestion updates or weather conditions. In an embodiment, data relating to the environment 190 is transmitted to the AV 100 via a communications channel from a remotely located database 134.

In an embodiment, the AV system 120 includes communications devices 140 for communicating measured or inferred properties of other vehicles' states and conditions, such as positions, linear and angular velocities, linear and angular accelerations, and linear and angular headings to the AV 100. These devices include Vehicle-to-Vehicle (V2V) and Vehicle-to-Infrastructure (V2I) communication devices and devices for wireless communications over point-to-point or ad hoc networks or both. In an embodiment, the communications devices 140 communicate across the electromagnetic spectrum (including radio and optical communications) or other media (e.g., air and acoustic media). A combination of Vehicle-to-Vehicle (V2V) Vehicle-to-Infrastructure (V2I) communication (and, in some embodiments, one or more other types of communication) is sometimes referred to as Vehicle-to-Everything (V2X) communication. V2X communication typically conforms to one or more communications standards for communication with, between, and among autonomous vehicles.

In an embodiment, the communication devices 140 include communication interfaces. For example, wired, wireless, WiMAX, Wi-Fi, Bluetooth, satellite, cellular, optical, near field, infrared, or radio interfaces. The communication interfaces transmit data from a remotely located database 134 to AV system 120. In an embodiment, the remotely located database 134 is embedded in a cloud computing environment 200 as described in FIG. 2. The communication interfaces 140 transmit data collected from sensors 121 or other data related to the operation of AV 100 to the remotely located database 134. In an embodiment, communication interfaces 140 transmit information that relates to teleoperations to the AV 100. In some embodiments, the AV 100 communicates with other remote (e.g., "cloud") servers 136.

In an embodiment, the remotely located database 134 also stores and transmits digital data (e.g., storing data such as road and street locations). Such data is stored on the memory 144 on the AV 100, or transmitted to the AV 100 via a communications channel from the remotely located database 134.

In an embodiment, the remotely located database 134 stores and transmits historical information about driving properties (e.g., speed and acceleration profiles) of vehicles that have previously traveled along trajectory 198 at similar times of day. In one implementation, such data may be stored on the memory 144 on the AV 100, or transmitted to the AV 100 via a communications channel from the remotely located database 134.

Computing devices 146 located on the AV 100 algorithmically generate control actions based on both real-time sensor data and prior information, allowing the AV system 120 to execute its autonomous driving capabilities.

In an embodiment, the AV system 120 includes computer peripherals 132 coupled to computing devices 146 for providing information and alerts to, and receiving input from, a user (e.g., an occupant or a remote user) of the AV 100. In an embodiment, peripherals 132 are similar to the display 312, input device 314, and cursor controller 316 discussed below in reference to FIG. 3. The coupling is wireless or wired. Any two or more of the interface devices may be integrated into a single device.

Example Cloud Computing Environment

Figure 2:
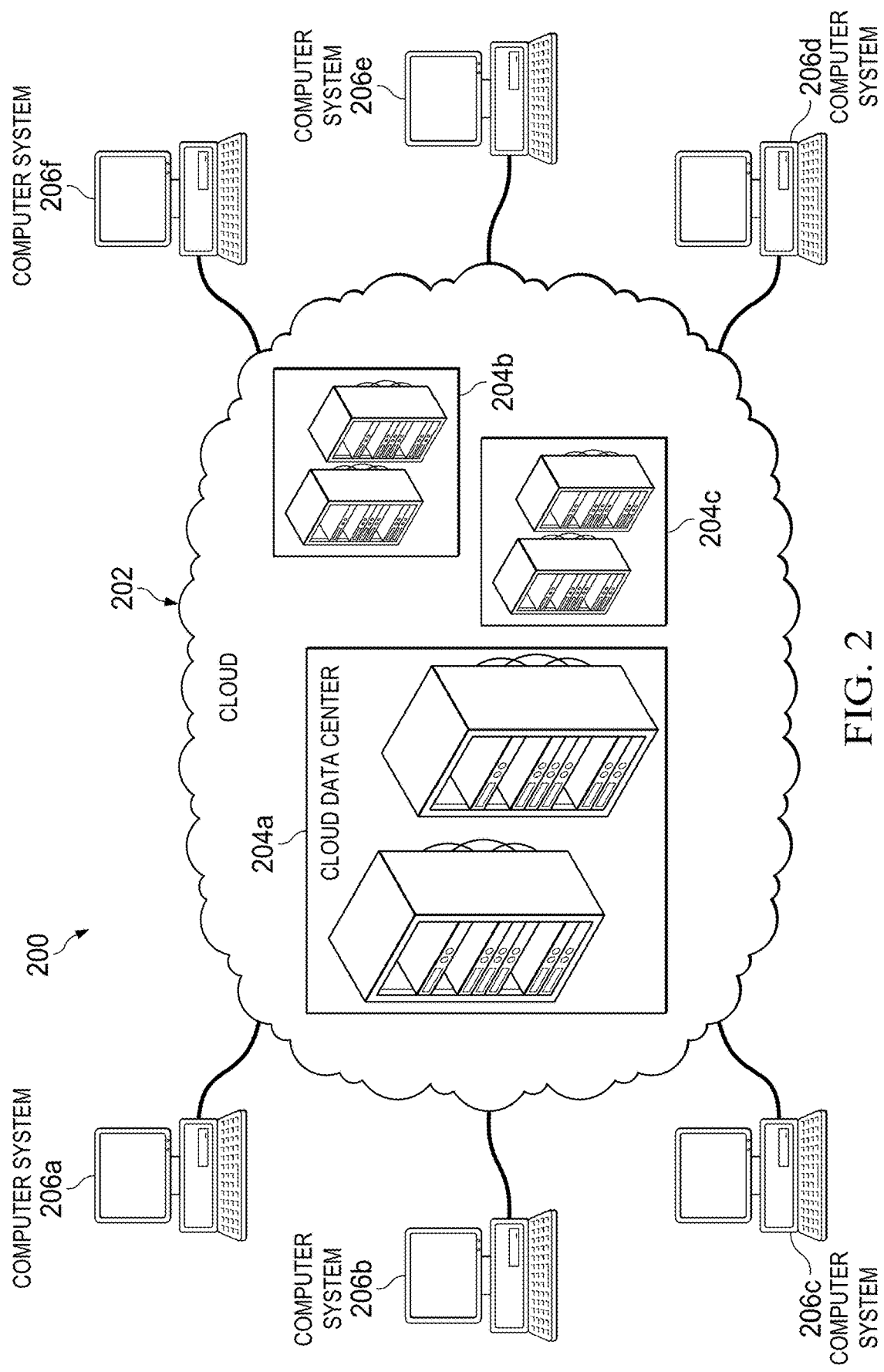
FIG. 2 illustrates an example "cloud" computing environment, in accordance with one or more embodiments.

FIG. 2 illustrates an example "cloud" computing environment. Cloud computing is a model of service delivery for enabling convenient, on-demand network access to a shared pool of configurable computing resources (e.g. networks, network bandwidth, servers, processing, memory, storage, applications, virtual machines, and services). In typical cloud computing systems, one or more large cloud data centers house the machines used to deliver the services provided by the cloud. Referring now to FIG. 2, the cloud computing environment 200 includes cloud data centers 204a, 204b, and 204c that are interconnected through the cloud 202. Data centers 204a, 204b, and 204c provide cloud computing services to computer systems 206a, 206b, 206c, 206d, 206e, and 206f connected to cloud 202.

The cloud computing environment 200 includes one or more cloud data centers. In general, a cloud data center, for example the cloud data center 204a shown in FIG. 2, refers to the physical arrangement of servers that make up a cloud, for example the cloud 202 shown in FIG. 2, or a particular portion of a cloud. For example, servers are physically arranged in the cloud datacenter into rooms, groups, rows, and racks. A cloud datacenter has one or more zones, which include one or more rooms of servers. Each room has one or more rows of servers, and each row includes one or more racks. Each rack includes one or more individual server nodes. In some implementation, servers in zones, rooms, racks, and/or rows are arranged into groups based on physical infrastructure requirements of the datacenter facility, which include power, energy, thermal, heat, and/or other requirements. In an embodiment, the server nodes are similar to the computer system described in FIG. 3. The data center 204a has many computing systems distributed through many racks.

The cloud 202 includes cloud data centers 204a, 204b, and 204c along with the network and networking resources (for example, networking equipment, nodes, routers, switches, and networking cables) that interconnect the cloud data centers 204a, 204b, and 204c and help facilitate the computing systems' 206a-f access to cloud computing services. In an embodiment, the network represents any combination of one or more local networks, wide area networks, or internetworks coupled using wired or wireless links deployed using terrestrial or satellite connections. Data exchanged over the network, is transferred using any number of network layer protocols, such as Internet Protocol (IP), Multiprotocol Label Switching (MPLS), Asynchronous Transfer Mode (ATM), Frame Relay, etc. Furthermore, in embodiments where the network represents a combination of multiple sub-networks, different network layer protocols are used at each of the underlying sub-networks. In some embodiments, the network represents one or more interconnected internetworks, such as the public Internet.

The computing systems 206a-f or cloud computing services consumers are connected to the cloud 202 through network links and network adapters. In an embodiment, the computing systems 206a-f are implemented as various computing devices, for example servers, desktops, laptops, tablet, smartphones, Internet of Things (IoT) devices, autonomous vehicles (including, cars, drones, shuttles, trains, buses, etc.) and consumer electronics. In an embodiment, the computing systems 206a-f are implemented in or as a part of other systems.

Computer System

Figure 3:
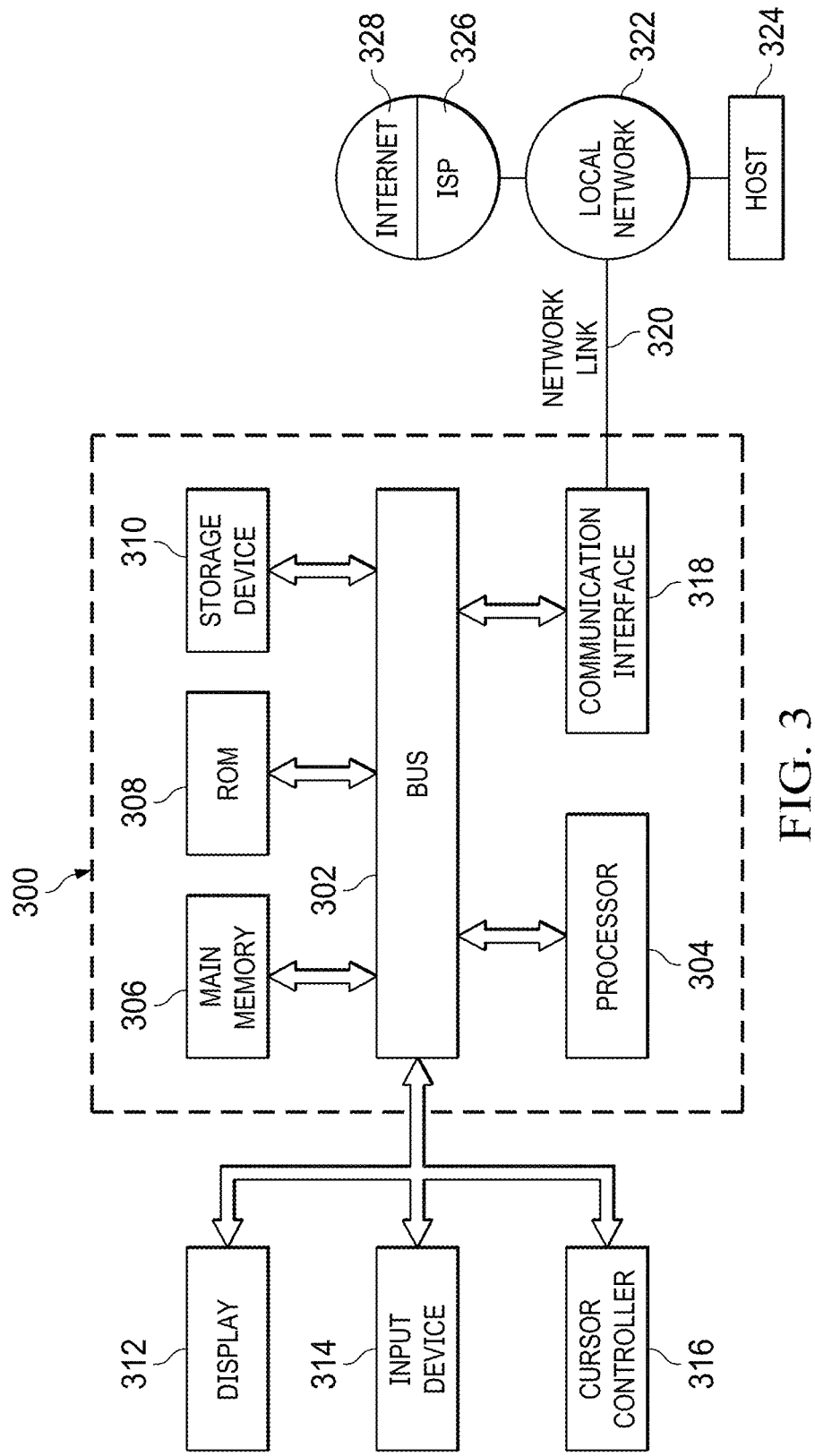
FIG. 3 illustrates a computer system, in accordance with one or more embodiments.

FIG. 3 illustrates a computer system 300. In an implementation, the computer system 300 is a special purpose computing device. The special-purpose computing device is hard-wired to perform the techniques or includes digital electronic devices such as one or more application-specific integrated circuits (ASICs) or field programmable gate arrays (FPGAs) that are persistently programmed to perform the techniques or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. In various embodiments, the special-purpose computing devices are desktop computer systems, portable computer systems, handheld devices, network devices or any other device that incorporates hard-wired and/or program logic to implement the techniques.

In an embodiment, the computer system 300 includes a bus 302 or other communication mechanism for communicating information, and a hardware processor 304 coupled with a bus 302 for processing information. The hardware processor 304 is, for example, a general-purpose microprocessor. The computer system 300 also includes a main memory 306, such as a random-access memory (RAM) or other dynamic storage device, coupled to the bus 302 for storing information and instructions to be executed by processor 304. In one implementation, the main memory 306 is used for storing temporary variables or other intermediate information during execution of instructions to be executed by the processor 304. Such instructions, when stored in non-transitory storage media accessible to the processor 304, render the computer system 300 into a special-purpose machine that is customized to perform the operations specified in the instructions.

In an embodiment, the computer system 300 further includes a read only memory (ROM) 308 or other static storage device coupled to the bus 302 for storing static information and instructions for the processor 304. A storage device 310, such as a magnetic disk, optical disk, solid-state drive, or three-dimensional cross point memory is provided and coupled to the bus 302 for storing information and instructions.

In an embodiment, the computer system 300 is coupled via the bus 302 to a display 312, such as a cathode ray tube (CRT), a liquid crystal display (LCD), plasma display, light emitting diode (LED) display, or an organic light emitting diode (OLED) display for displaying information to a computer user. An input device 314, including alphanumeric and other keys, is coupled to bus 302 for communicating information and command selections to the processor 304. Another type of user input device is a cursor controller 316, such as a mouse, a trackball, a touch-enabled display, or cursor direction keys for communicating direction information and command selections to the processor 304 and for controlling cursor movement on the display 312. This input device typically has two degrees of freedom in two axes, a first axis (e.g., x-axis) and a second axis (e.g., y-axis), that allows the device to specify positions in a plane.

According to one embodiment, the techniques herein are performed by the computer system 300 in response to the processor 304 executing one or more sequences of one or more instructions contained in the main memory 306. Such instructions are read into the main memory 306 from another storage medium, such as the storage device 310. Execution of the sequences of instructions contained in the main memory 306 causes the processor 304 to perform the process steps described herein. In alternative embodiments, hard-wired circuitry is used in place of or in combination with software instructions.

The term "storage media" as used herein refers to any non-transitory media that store data and/or instructions that cause a machine to operate in a specific fashion. Such storage media includes non-volatile media and/or volatile media. Non-volatile media includes, for example, optical disks, magnetic disks, solid-state drives, or three-dimensional cross point memory, such as the storage device 310. Volatile media includes dynamic memory, such as the main memory 306. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NV-RAM, or any other memory chip or cartridge.

Storage media is distinct from but may be used in conjunction with transmission media. Transmission media participates in transferring information between storage media. For example, transmission media includes coaxial cables, copper wire and fiber optics, including the wires that include the bus 302. Transmission media can also take the form of acoustic or light waves, such as those generated during radio-wave and infrared data communications.

In an embodiment, various forms of media are involved in carrying one or more sequences of one or more instructions to the processor 304 for execution. For example, the instructions are initially carried on a magnetic disk or solid-state drive of a remote computer. The remote computer loads the instructions into its dynamic memory and send the instructions over a telephone line using a modem. A modem local to the computer system 300 receives the data on the telephone line and use an infrared transmitter to convert the data to an infrared signal. An infrared detector receives the data carried in the infrared signal and appropriate circuitry places the data on the bus 302. The bus 302 carries the data to the main memory 306, from which processor 304 retrieves and executes the instructions. The instructions received by the main memory 306 may optionally be stored on the storage device 310 either before or after execution by processor 304.

The computer system 300 also includes a communication interface 318 coupled to the bus 302. The communication interface 318 provides a two-way data communication coupling to a network link 320 that is connected to a local network 322. For example, the communication interface 318 is an integrated service digital network (ISDN) card, cable modem, satellite modem, or a modem to provide a data communication connection to a corresponding type of telephone line. As another example, the communication interface 318 is a local area network (LAN) card to provide a data communication connection to a compatible LAN. In some implementations, wireless links are also implemented. In any such implementation, the communication interface 318 sends and receives electrical, electromagnetic, or optical signals that carry digital data streams representing various types of information.

The network link 320 typically provides data communication through one or more networks to other data devices. For example, the network link 320 provides a connection through the local network 322 to a host computer 324 or to a cloud data center or equipment operated by an Internet Service Provider (ISP) 326. The ISP 326 in turn provides data communication services through the world-wide packet data communication network now commonly referred to as the "Internet" 328. The local network 322 and Internet 328 both use electrical, electromagnetic, or optical signals that carry digital data streams. The signals through the various networks and the signals on the network link 320 and through the communication interface 318, which carry the digital data to and from the computer system 300, are example forms of transmission media. In an embodiment, the network 320 contains the cloud 202 or a part of the cloud 202 described above.

The computer system 300 sends messages and receives data, including program code, through the network(s), the network link 320, and the communication interface 318. In an embodiment, the computer system 300 receives code for processing. The received code is executed by the processor 304 as it is received, and/or stored in storage device 310, or other non-volatile storage for later execution.

Autonomous Vehicle Architecture

Figure 4:
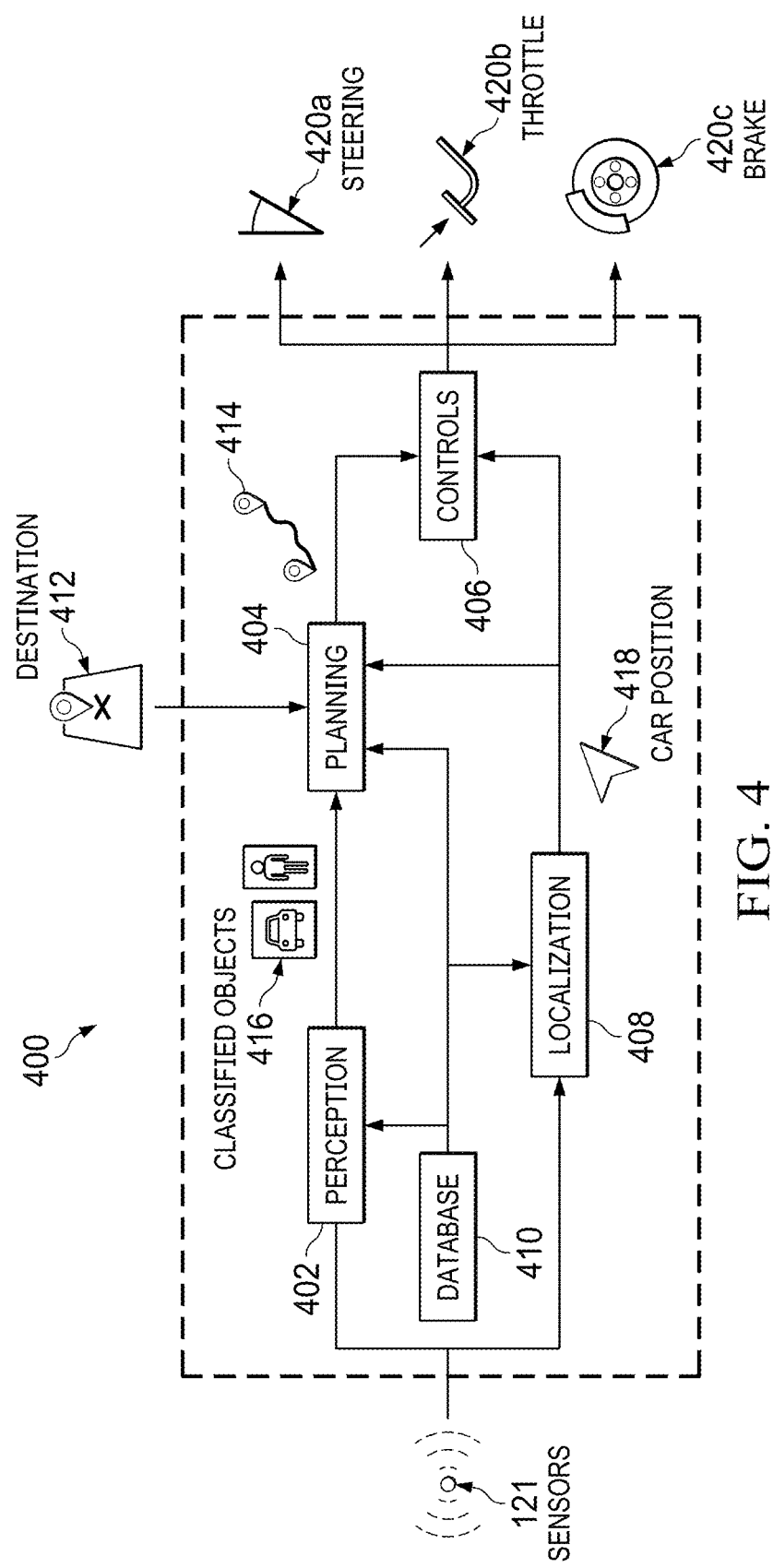
FIG. 4 shows an example architecture for an AV, in accordance with one or more embodiments.

FIG. 4 shows an example architecture 400 for an autonomous vehicle (e.g., the AV 100 shown in FIG. 1). The architecture 400 includes a perception module 402 (sometimes referred to as a perception circuit), a planning module 404 (sometimes referred to as a planning circuit), a control module 406 (sometimes referred to as a control circuit), a localization module 408 (sometimes referred to as a localization circuit), and a database module 410 (sometimes referred to as a database circuit). Each module plays a role in the operation of the AV 100. Together, the modules 402, 404, 406, 408, and 410 may be part of the AV system 120 shown in FIG. 1. In some embodiments, any of the modules 402, 404, 406, 408, and 410 is a combination of computer software (e.g., executable code stored on a computer-readable medium) and computer hardware (e.g., one or more microprocessors, microcontrollers, application-specific integrated circuits [ASICs]), hardware memory devices, other types of integrated circuits, other types of computer hardware, or a combination of any or all of these things).

In use, the planning module 404 receives data representing a destination 412 and determines data representing a trajectory 414 (sometimes referred to as a route) that can be traveled by the AV 100 to reach (e.g., arrive at) the destination 412. In order for the planning module 404 to determine the data representing the trajectory 414, the planning module 404 receives data from the perception module 402, the localization module 408, and the database module 410.

The perception module 402 identifies nearby physical objects using one or more sensors 121, e.g., as also shown in FIG. 1. The objects are classified (e.g., grouped into types such as pedestrian, bicycle, automobile, traffic sign, etc.) and a scene description including the classified objects 416 is provided to the planning module 404.

The planning module 404 also receives data representing the AV position 418 from the localization module 408. The localization module 408 determines the AV position by using data from the sensors 121 and data from the database module 410 (e.g., a geographic data) to calculate a position. For example, the localization module 408 uses data from a GNSS receiver and geographic data to calculate a longitude and latitude of the AV. In an embodiment, data used by the localization module 408 includes high-precision maps of the roadway geometric properties, maps describing road network connectivity properties, maps describing roadway physical properties (such as traffic speed, traffic volume, the number of vehicular and cyclist traffic lanes, lane width, lane traffic directions, or lane marker types and locations, or combinations of them), and maps describing the spatial locations of road features such as crosswalks, traffic signs or other travel signals of various types.

The control module 406 receives the data representing the trajectory 414 and the data representing the AV position 418 and operates the control functions 420a-c (e.g., steering, throttling, braking, ignition) of the AV in a manner that will cause the AV 100 to travel the trajectory 414 to the destination 412. For example, if the trajectory 414 includes a left turn, the control module 406 will operate the control functions 420a-c in a manner such that the steering angle of the steering function will cause the AV 100 to turn left and the throttling and braking will cause the AV 100 to pause and wait for passing pedestrians or vehicles before the turn is made.

In an embodiment, any of the foregoing modules 402, 404, 406, 408 can send a request to a rule-based trajectory validation system 500 to validate a planned trajectory and receive a score for the trajectory, as described in further detail in reference to FIGS. 5-18.

Scenario Based Behavior Specification and Validation

Figure 5:
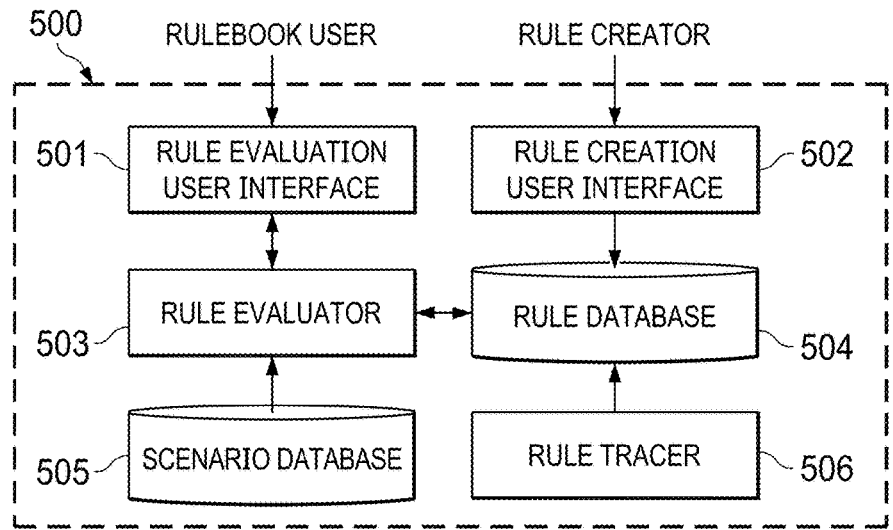
FIG. 5 is a block diagram of a rule-based trajectory evaluation system, in accordance with one or more embodiments.

FIG. 5 is a block diagram of a rule-based trajectory evaluation system 500, in accordance with one or more embodiments. The architecture of system 500 can be implemented on a cloud platform (e.g., for simulation and research purposes) and/or can be accessed directly by software modules of external systems, such as, e.g., modules 402, 404, 406, 408 described in reference to FIG. 4. Users can access the system through a webpage or portal. System 500 includes rule evaluation user interface (UI) 501, rule creation UI 502, rule evaluator 503, rule database 504, scenario database 505 and rule tracer 506.

In an embodiment where system 500 is a cloud-based platform, rule evaluation UI 501 allows users to select scenarios and trajectories for rule evaluation. Rule creation UI 502 allows rule creators (e.g., individuals, users, and/or the like) to create rules based on traffic laws and common sense and stores those rules in rules database 504. Rule evaluator 503 receives a scenario configuration and trajectory from scenario database 505 which was selected by a user through UI 501, reads rulebook(s) from rules database 504 and uses those rulebook(s) to score the trajectory, as described more fully in reference to FIG. 6.

In an embodiment, rule evaluator 503 includes an application programming interface (API) that allows external systems to programmatically request evaluation of a trajectory directly from rule evaluator 503. For example, planning module 404 can use the API to request a planned trajectory evaluation, provide the planned trajectory and map identifiers (IDs) to rule evaluator 503 through the API, and receive a score for the trajectory from rule evaluator 503 through the API. In an embodiment, rules database 504 stores various rules in the form of a pre-ordered, hierarchical rulebook, as described more fully in reference to FIGS. 12-16. Rules can be provided from (e.g., represent) laws and regulations, derived by machine learning algorithms from human knowledge and any other source. System 500 includes an ingestion engine (not shown) that ingests the rules and stores the rules in rulebooks in rules database 504 in a manner that allows the rules to be accessed by rule evaluator 503 (e.g., using an index). In an embodiment, the rules are organized in a hierarchical object-oriented data structure that include data and operations, as described more fully in reference to FIG. 16. In an embodiment, the rule database 504 stores various rules in the form of pre-order on different degrees of rule violations. For example, having less than 0.8 violation for parked car clearance is more important than reaching the goal, which is more important than having less than 0.1 violation for parked car clearance.

Rule tracer 506 traces correspondence between rules and traffic laws. Rule sources include but are not limited to: texts (e.g., laws, customs), common sense, numerical studies (e.g., machine learning analytics) or combination of them. Rule tracer 506 provides users with information that allows the users to know what sources the rulebooks cover. Rule tracer 506 can also be used in evaluating the causes of accidents in the event of litigation. In an embodiment, rule sources include but are not limited to: a webpage (that may be automatically and periodically "crawled" by a search engine), a document, a statement, a law, a description, etc. The rules can be stored in rule database 504 in a data structure that includes one or more pointers that point to corresponding sources.

In an embodiment, system 500 generates a diagram that shows the relationship between rules and sources by drawing links between rules and sources to show traceability and track completeness of rules. In an embodiment, rule tracing can be based on natural language processing, where natural language statements of rules are converted automatically to temporal logic expressions and stored in rule database 504.

Scenario database 505 stores various driving scenarios. Examples of driving scenarios include any situation or circumstance that a vehicle may encounter in the real-world. An example scenario can include a scenario that is associated with (e.g., involves, concentrates on, and/or the like) an avoidance maneuver at a particular map location performed with one or more agents (e.g., other vehicles, pedestrians) present in the vicinity, in a variety of different road geometries (e.g., near or at junctions and intersections, lane splittings and lane reductions, turns and filtering lanes, etc.). Each scenario can be designed to emphasize certain aspects of a behavior to be tested. Each of the scenarios can define limits of acceptable behavior, determine common anomalies, which include both behavioral patterns of human drivers to be avoided, and unreasonable decisions made by the vehicle. Scenarios include checks to validate the full complexity of potential behaviors in the scenario. FIGS. 6A-6D illustrate example scenarios.

Figure 6A:
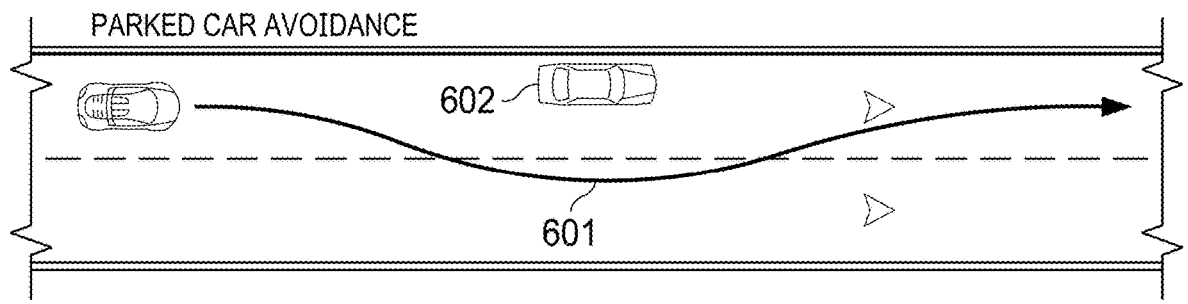
FIGS. 6A-6D illustrate various driving scenarios, in accordance with one or more embodiments.

FIG. 6A illustrates a parked car avoidance scenario, where the objective is for an expected path 601 of an ego vehicle to avoid a single parked car 602 in the same lane as the ego vehicle on a straight road segment, and maintaining appropriate values of longitudinal and lateral distances.

Figure 6B:
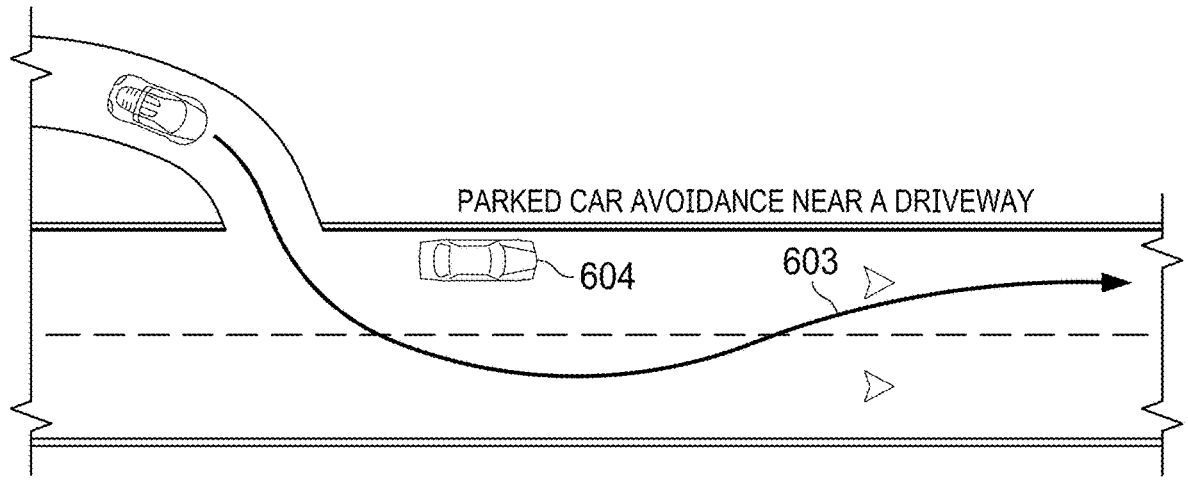

FIG. 6B illustrates a parked car avoidance near a driveway scenario, where the objective is for an expected path 603 of the ego vehicle to avoid a single parked car 604 on a straight road segment when exiting a driveway into the same lane as the parked car, and maintaining appropriate values of longitudinal and lateral distances.

Figure 6C:
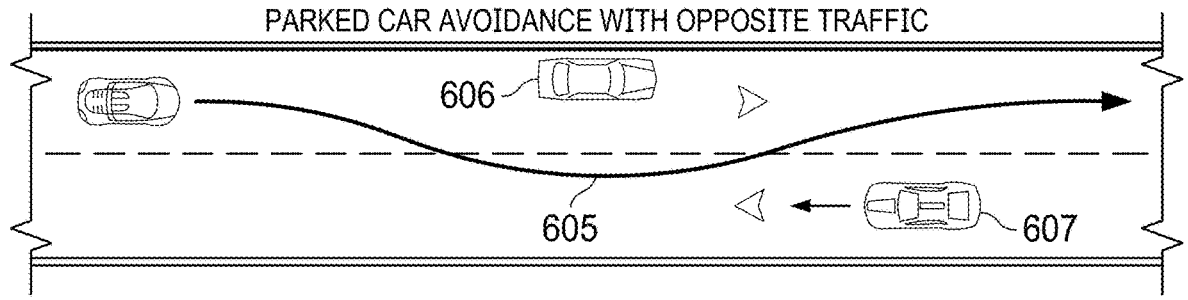

FIG. 6C is a parked car avoidance with opposite traffic scenario where the expected path 605 of the ego vehicle may stop behind a parked car 606, yielding to traffic 607, but should not do so after the maneuver has already been initiated.

Figure 6D:
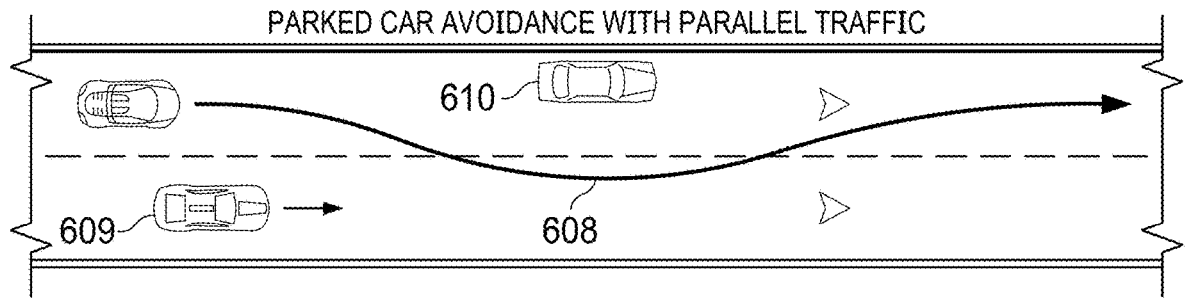

FIG. 6D is a parked car avoidance with parallel traffic scenario, where an important validation is the distance of expected path 608 to/from the other agent 610 during any moment of the avoidance the maneuver.

The example scenarios illustrated in FIGS. 6A-6D are presented to aid the reader in understanding the types of driving scenarios that can be handled by system 500. In practice, system 500 would evaluate and validate any desired driving scenario with any number of agents at any number of locations in the vicinity of the ego vehicle having any number of initial physical states (e.g., position, velocity, acceleration, heading) or mental states (e.g., simulated driving aggressiveness, excessive braking and acceleration, etc.) that can be used in evaluation of trajectories.

Figure 7:
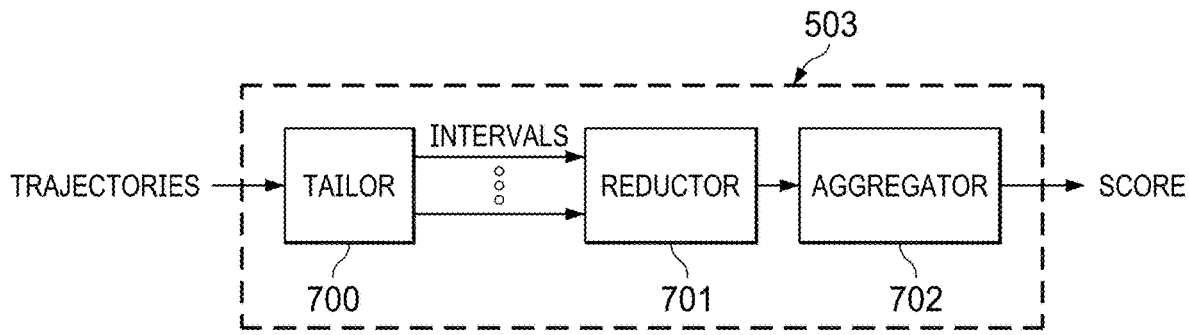
FIG. 7 is a flow diagram of a rule-based trajectory evaluation process, in accordance with one or more embodiments.

FIG. 7 is a flow diagram of a rule-based trajectory evaluation process 700, in accordance with one or more embodiments. As previously described, rule evaluator 503 performs two or three steps depending on whether an optional tailoring step is performed. In a general use case, and given a trajectory, the rule evaluator 503 analyzes the input data in three steps: tailoring, reduction and aggregation. Tailor unit 700 divides the trajectory into multiple time intervals, where the simplest time interval is between two consecutive timestamps. In some embodiments, the time interval can be longer to cover multiple timestamps. In an embodiment, the entire trajectory is considered as a single time interval, in which case the tailoring step is not performed.

Reductor unit 701 associates each time interval with a metric used to evaluate the trajectory. In an embodiment, an STL framework is used to specify driving rules and an AGM framework is used to score or measure the robustness of a trajectory. The STL framework uses qualitative and quantitative semantics to assess whether and how well a trajectory follows rules in a rulebook. The AGM framework uses arithmetic and geometric means to account for degrees of robustness, such that trajectories that satisfy rules at more timesteps receive higher scores. In other embodiments, other methods can be used to express system behavior under complex temporal requirements, including but not limited to: LTL, MTL, and TWTL. Also, other embodiments can use different scoring methods, including but not limited to: heuristic optimization approaches (e.g., particle swarm optimization, simulated annealing, RRTs) and MILP.

Aggregator unit 702 aggregates all the metrics of the time intervals to summarize a single score for the entire trajectory. In an embodiment, the reduction and aggregation steps are integrated into a single step. If the tailoring step is not performed by tailor unit 700, the reduction and aggregation steps are degenerated into a single step.

Figure 8:
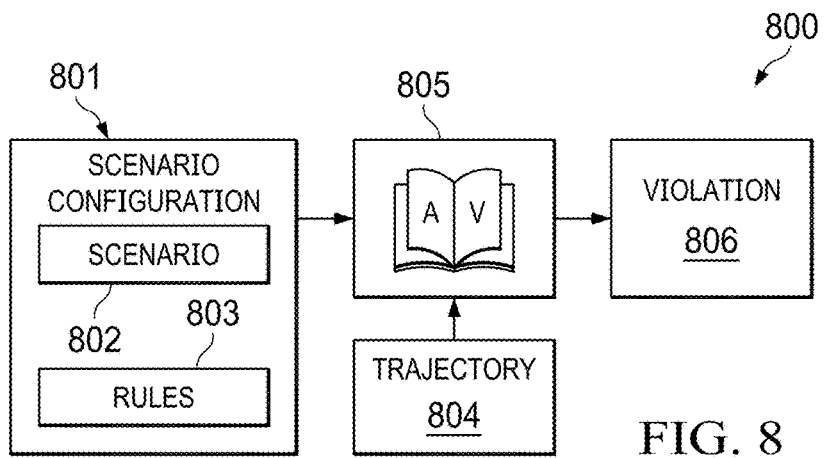
FIG. 8 illustrates behavior validation using a rulebook, in accordance with one or more embodiments.

FIG. 8 illustrates behavior validation using a rulebook, in accordance with one or more embodiments. A scenario configuration 801 specified by a user (e.g., human user, software module) includes a scenario 802 and rules 803 associated with the scenario. Trajectory 804 is evaluated 805 for violations 806 of rules 803 and a degree to which each violated rule is violated. For example, the scenario 802 illustrated in FIG. 6A has a rule 803 to avoid the parked car and the violation metrics include longitudinal distance and lateral distance. If the ego vehicle does not maintain the desired longitudinal and lateral distance metrics, the rules 803 will be deemed violated.

Violation Metrics

Rule statements, such as "the distance between ego and a pedestrian should not exceed the clearance threshold" can be used to determine whether a particular trajectory does or does not satisfy a rule, such as "maintain clearance with pedestrians." This Boolean view of rules allows differentiation between "good" and "bad" trajectories, but cannot differentiate among two or more violating trajectories. For example, the Boolean view would be indifferent between exceeding the posted speed limit by 5% or by 150%. To rank two or more violating trajectories, the degree to which a trajectory violates a rule statement needs to be quantified. In an embodiment, the degree of violation is quantified by defining a violation metric for each rule statement.

In general, a violation metric is an expression of the disutility associated with a trajectory that violates a rule statement. In some embodiments, empirical evidence can be used to determine a degree of violation. Some examples of empirical evidence include but are not limited to: crowd-sourced data on what human assessors find 'reasonable', revealed preferences in human driver data, specifically designed experiments to measure parameters from human drivers and expert elicitation studies with law enforcement or other authorities.

In general, it is desirable that violation metrics have a formulation for: 1) the degree of violation at a single point in time with respect to a single instance (e.g., one pedestrian, one stop sign), defined hereinafter as the "instantaneous violation metric"; 2) the aggregation of the instantaneous violation metric over time (e.g., sum over time of violations of clearance around one given pedestrian), defined as the "instance violation metric"; 3) the aggregation of violation over multiple instances (e.g., sum of clearance violations over time and over pedestrians in a pedestrian clearance rule), defined hereafter as the "total violation metric"; and 4) the unit of the total violation score. The next sections discuss each of the above four steps. The last section formalizes the concept of infringement distance.

Instantaneous Violation Metric

Figure 9:
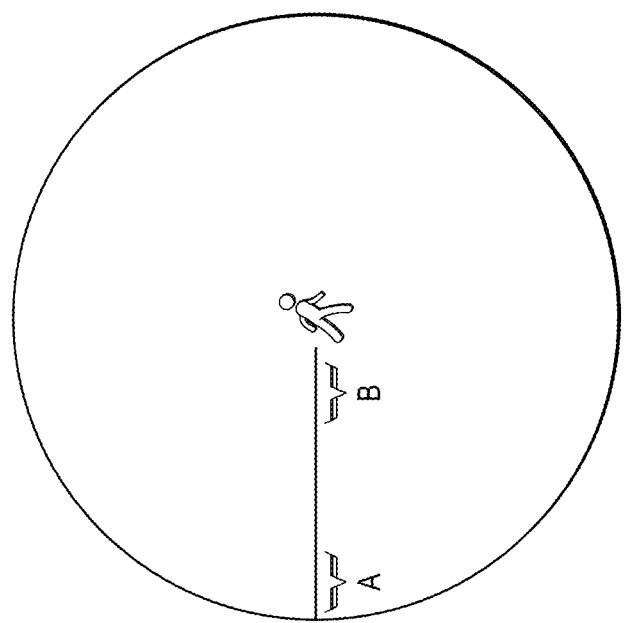
FIG. 9 illustrates a linear violation metric that implies that a change in clearance infringement represented by A has the same value that is represented by B, in accordance with one or more embodiments.

Each point on a trajectory that violates a rule statement corresponds to some degree of violation, which implies some disutility. In some embodiments, the degree of violation depends on one or more of the following quantities: distance (e.g., clearance infringement); speed (e.g., excess speed above a threshold, speed when traversing a stopping zone); and acceleration (e.g., excess acceleration above a comfort threshold). The greater these quantities, the more violation occurs. For example, if ego infringes by 10 cm on a clearance threshold, this clearly represents more violation than if ego infringes by 5 cm. Thus, the violation could be a monotonically increasing function of the relevant quantity. In the clearance infringement example, let us assume the clearance threshold is 1 m for a pedestrian. A linear violation metric implies that within the 1 m clearance, we attach the same utility to moving 10 cm further away from the pedestrian regardless of how close we are to the pedestrian, as illustrated in FIG. 9. However, changes in infringement of the rule statement may become more important when the ego is close to the pedestrian than when the ego is still far away from the pedestrian. It may be difficult to directly measure the disutility experienced by a pedestrian for different clearance values to construct a non-linear relationship. In an embodiment, the non-linear relationship can be constructed from the distribution of observed clearance distances in real traffic situations.

Figure 10:
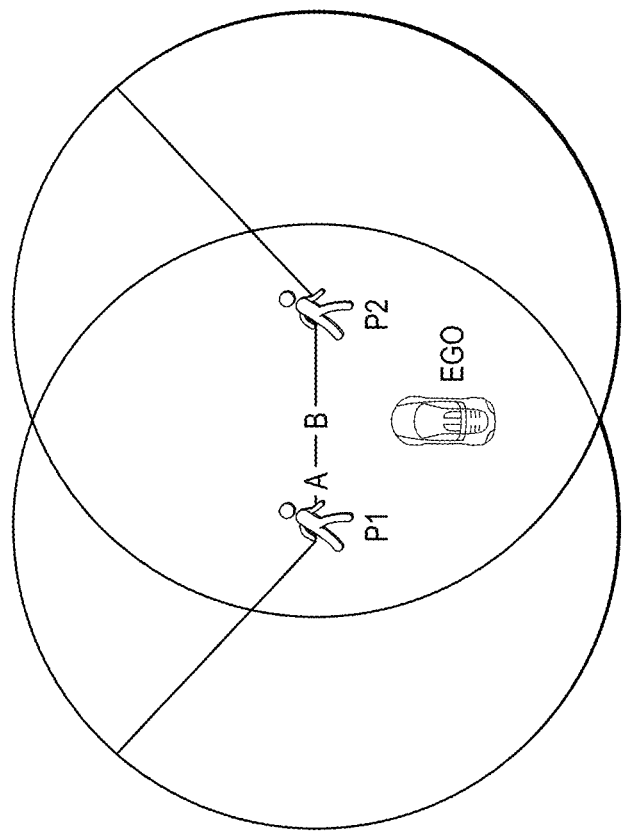
FIG. 10 illustrates a consensus that suggests that passing through B is a better option than passing through A, in accordance with one or more embodiments.

Consider the situation in FIG. 10, which assumes that ego is located between two pedestrians in a situation of unavoidable violation. If the violation is a linear function of the clearance infringement, we would be indifferent between passing through point A or B. For example, assume that the clearance threshold is 1 m for any pedestrian and that the pedestrians are 50 cm apart. If A is 5 cm away from pedestrian P1, then the clearance infringement with respect to P1 is 95 cm and the clearance infringement with respect to P2 is 55 cm, so the total violation is 1.5 m. If B is halfway between the two pedestrians, then the clearance infringement is 75 cm for both pedestrians, so the total violation is also 1.5 m. However, a reasonable crowd may find that B is preferable to A. While this partially reflects a notion of fairness, the improvement in utility that pedestrian P2 experiences when ego choses A instead of B is not worth as much as the deterioration of utility for P1. Therefore, in an embodiment the instantaneous violation metric is a nonlinear function of the infringement distance.

If data to choose among many possible nonlinear monotonically increasing functions is unavailable, guiding principles are used to settle on the simplest form (e.g., Occam's razor), which in an embodiment is a quadratic function. In the example of FIG. 10, the minimum violation occurs when ego choses option B. Note that using the same numbers as above but using a squared clearance infringement distance, option A results in a total violation of 1.205 while option B results in a total violation of 1.125. To still use intuitive units for the total violation metrics, the square root is computed after aggregating over time and/or instances, which effectively makes the aggregation an $L^2$ norm (see below). In an embodiment, the parameters of a quadratic or other nonlinear monotonically increasing function is determined for individual rules based on data.

Instance Violation Metric (Aggregation Over Time)

An ego trajectory does not consist of a single point but a sequence of positions over time, spanning the duration of a scenario. Therefore, to be able to rank trajectories, the instantaneous violation metric is aggregated over time. In some embodiments, the ranking depends on whether a rule was mildly violated by a trajectory over a long time or violated severely over a short time. In some embodiments, the ranking depends on an average violation over time or a maximum violation over time. The quadratic function from the previous section assures that large violations of the underlying quantities (e.g., large infringements, large excess velocities or accelerations) are not disproportionately penalized. In an embodiment, an additional functional form can be imposed to prefer either longer mild violations or shorter violations in the absence of specific evidence supporting one over the other.

In some embodiments, if the rule deals with a transient interaction between ego and a road feature (e.g., road users, traffic signs, traffic markers, road infrastructure, etc.), then a maximum instantaneous violation score is used for the interaction. If the rule deals with a continuous constraint on ego's behavior, then the integral of the instantaneous violation score over the total time of the interaction is used for the interaction.

Transient interactions include passing a pedestrian, navigating a crosswalk, or passing a parked car. One reason for not using a time integral is that it would incentivize ego to complete the interaction as quickly as possible to minimize the aggregate violation, which is an undesirable artifact of such a rule formulation.

Continuous constraints include speed and acceleration limits, staying on the drivable area, or car following. A reason for not using a maximum instantaneous violation score is that once a trajectory has reached its highest violation score, ego would have no incentive to return to complying with a Rule. For example, in an example of an acceleration threshold for a passenger comfort rule, using the maximum would imply ego would be indifferent between two trajectories, even if the second has one more hard braking event than the first, for example.

Total Violation Metric

In the event that a trajectory encounters multiple instances that invoke a rule (e.g., multiple pedestrians, stop signs, or right turns), a second guiding principle of maximum expected utility is used to aggregate over the instances by taking the average (e.g., sum of instance violation scores divided by number of instances). This guiding principle assumes that the instance violation metrics already adequately approximate disutility.

In some embodiments, an alternative guiding principle can be used which is to minimize the maximum violation score among all the instances. In the case of multiple road users, this implies that a moderate disutility to many people is preferred over a larger disutility to a single person.

Units and Normalization

In an embodiment, all violation scores are converted to a universal measure of disutility (e.g., monetary damage). Some examples of overall rule violation scores are natural units of the violation scores and normalized violation scores. The first option requires that the square root of the aggregated violations over time and instances to be taken to return the units to their natural quantities such as distances, speeds, and accelerations. The second option determines the maximum possible unnormalized total violation score for each rule, and divides by this maximum to return a violation score between 0 (no violation) and 1 (maximum violation), where one divided by this maximum is hereinafter also referred to as a "normalization" factor. To facilitate comparisons of violation scores between rule formulations, some global constants are selected, such as the maximum speed that ego could attain in any scenario, or the maximum possible infringement of the undriveable area. The choice of option depends on the application. For close examination of individual rule violation scores and ranking or trajectories in a pre-order framework, natural units are most informative. For comparison of violation scores across rules, normalized scores are more intuitive.

Infringement Distance

Many rule formulations involve the notion of an infringement distance. In the rules, the distances invoked are usually between two solid objects of varying shapes (e.g., rectangular ego footprint, straight line segments for the side of the driveable area, circle for a clearance zone around a pedestrian). Intuitively, the infringement distance is the distance by which ego vehicle surpasses a boundary.

Figure 11:
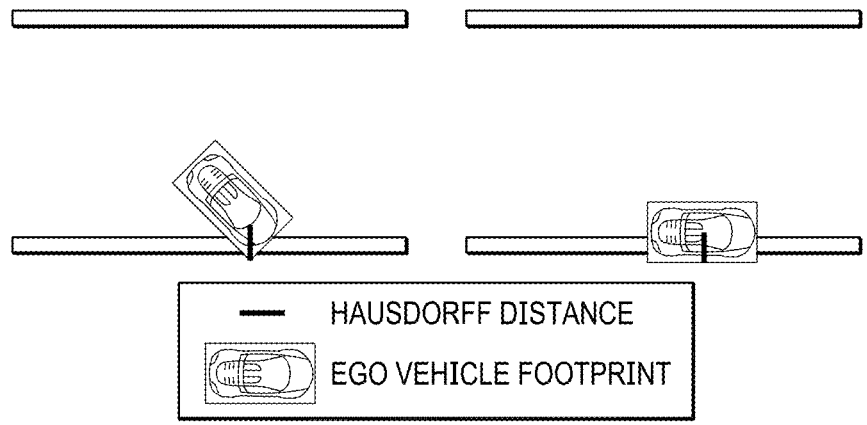
FIG. 11 illustrates infringement distance in the case of a rule for the ego to stay in a drivable area, in accordance with one or more embodiments.

Referring to FIG. 11, the notion of Hausdorff distance fits well with the concept of infringement distance. The ego footprint is a non-empty subset of the two-dimensional Euclidean space. Other "zones" (e.g., clearance zone, non-driveable area) are also non-empty subsets of the two-dimensional Euclidean space. The Hausdorff distance is defined as the greatest of all the distances from a point in one set to the closest point in another set. In the scenario shown in FIG. 11, the rule is to "stay in the driveable area," and the Hausdorff distance corresponds to the distance between the point of ego's footprint 1101 that is most outside of the driveable area 1100 and the closest point in the driveable area. In the case of pedestrian clearance, the Hausdorff distance reduces to the difference between the clearance threshold and the shortest distance between any two points of ego and the pedestrian.

Example Rule Formulation (Maintain Clearance With Inactive Vehicle)

Figure 12:
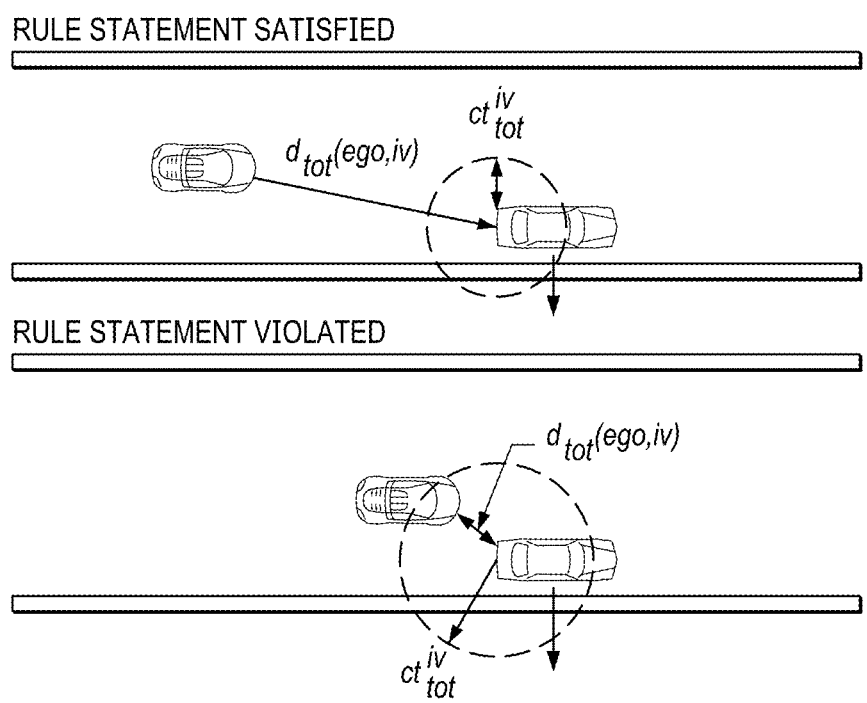
FIG. 12 illustrates a driving scenario involving an inactive vehicle where an example rule is that the ego is to maintain clearance with the inactive vehicle, in accordance with one or more embodiments.

FIG. 12 illustrates a driving scenario involving an inactive vehicle where an example rule is that the ego is to maintain clearance with the inactive vehicle, in accordance with one or more embodiments. An inactive vehicle is defined as a vehicle that is not actively participating in traffic. For example, the inactive vehicle may be parked/double-parked, loading/unloading, pulled over, or emergency-stopped, but it may not be stopped for a traffic light or otherwise waiting in traffic.

The rule for this driving scenario can be described using words as follows: "Ego should not come within a certain distance from an inactive vehicle that is on the road surface." This distance depends on the speed of the ego. The violation metric is based on ego's closest approach to the inactive vehicle and disproportionately penalizes large violations. The example rule is designed to meet passenger expectations of safe and courteous behavior in the vicinity of inactive vehicles. The rule formalizes an expectation not to get too close to the parked car or other inactive vehicle. The rule is designed to lead to an ego behavior that is acceptable for passengers of ego and passengers in the inactive vehicle. The rule can be applied when there is an inactive vehicle in some position along ego's trajectory. The rule only applies when ego speed is non-zero. This example rule assumes the ego is operating in a flat area so the rule is formulated in 2D space.

The rule statement can be expressed mathematically based on FIG. 12 as follows:

$$d_{tot}(ego,iv_i) > ct_{tot}^{iv} = ct_{min}^{iv}(t) + t_{ct}^{iv} v_{ego}(t), \text{ for all times } t \text{ and all } i=1,\ldots,n_{iv}. \quad [4]$$

An example instantaneous violation metric for a given inactive vehicle i is given by:

$$\rho_i(t) = \max(0, ct_{tot}^{iv}(t) - d_{tot}(ego,iv_i)(t))^2. \quad [5]$$

An example instance violation metric for a given inactive vehicle i is given by:

$$\rho_{T,i} = \max_{t \in [0,T]} \rho_i. \quad [6]$$

An example total violation metric and normalization factor are given by Equations [7] and [8], respectively:

$$\rho_{total} = \sqrt{\left(\frac{1}{n_{iv}}\right) \sum_{i=1}^{n_{iv}} \rho_{T,i}}, \quad [7]$$

$$\frac{1}{n\_f} = ct_{min}^{iv} + t_{ct}^{iv} v_{ego}^{max}. \quad [8]$$

In Equations [4]-[8], ego=ego vehicle, iv_i=inactive vehicle i, ct_{min}^{iv_i}=minimum clearance between ego and iv_i, ct_{tot}^{iv_i}=total clearance between ego and iv_i, t_{ct}^{iv}=increase in total clearance per unit increase of ego speed, v_ego=ego absolute speed, v_{ego}^{max}=maximum possible ego speed in any direction, n_{iv}=number of inactive vehicles and n_f=normalization factor.

Equations [4]-[8] assume that ego and the inactive vehicle are represented by rectangular bounding boxes, as shown in FIG. 12. In this example, the rule implementation computes the linear or Euclidean distance of the nearest points of the bounding boxes of ego and the inactive vehicle. In the absence of good information about clearance for legally parked cars in marked or unmarked spots and parked or inactive vehicles where no parked cars are expected, the above equations do not differentiate among these cases. In some embodiments, the rule may define different sub-rules for each case, with the same mathematical formulation but potentially different rule parameters and/or priorities. The parameter choice for safe distance may depend on weather, time of day, type of road. In an embodiment, the parameter choice for safe distance is a function of the ego speed with a slope. In this example, the closest approach to the inactive vehicle is considered because it is not an issue if more time is spent near the inactive vehicle and only the maximum infringement is important to show how close ego gets to the car. However, in another embodiment, the accumulation over time can be used. A maximum is used rather than the integral because the inactive vehicle clearance is a transient interaction, as described above.

Other rules will also influence behavior around inactive vehicles. Some examples of other rules include but are not limited to: "reach goal should remove the possibility of ego getting stuck behind the inactive vehicle," "satisfy the maximum speed limit should remove the possibility of ego moving too fast in an area with parked cars or other inactive vehicles," and the "behavior of the ego is different from overtaking a car with slower speed, which considers clearance in front, to the left, and to the right of ego separately, i.e., maintain clearance with active vehicles.

FIGS. 13A and 13B illustrate an example scenario configuration and trajectory data structures, respectively, in accordance with one or more embodiments. The example scenario configuration uses son files for defining a drivable area and a rulebook for Singapore. Formalization of a desired behavior in each scenario will consist of a series of independent rule evaluations and corresponding checks. Many checks can be reused throughout different scenarios with appropriate parameter changes. Examples of checks include, but are not limited to:

Reachability—a determination of whether the destination has been reached by the ego vehicle.

Collisions—a determination of whether the footprint of the ego vehicle ever intersected a footprint of any other object in the scenario.

Proximity rules checks—a determination of whether the ego vehicle ever came too close to an object at a too high speed. There are various rules regarding proximity that depend on a combination of the object type, as well as its location and speed, and the context.

Excessive acceleration/deceleration—a determination of whether the ego vehicle applied acceleration/deceleration that is deemed unreasonable for the given scenario.

Inappropriate stops—a determination that involves checking whether the ego vehicle came to a complete stop in the areas of traffic obstruction (e.g., a lane of opposite traffic flow during avoidance).

Turn signal usage—a determination of whether turns, avoidances, lane changes, as well as traveling in a roundabout require correct usage of the turn signal.

Curvature profile—includes measuring maximal curvature of the path and points of inflection (e.g., changes of curvature sign indicates weaving of the ego vehicle).

Path tube—when appropriate, an acceptable tube for defining the boundaries of the ego vehicle path can be specified. A useful check will determine maximal deviation of the path from the tube.

In the example shown in FIG. 13A, check parameters include drivability, curvature_bound, inflection_point, clearance, speed bound and speed_extrema. Each of these check parameters include one or more values. For example, the drivability check includes distance_to_undrivability (e.g., distance to a curb or barrier, in meters), the curvature_bound check includes max_curvature (e.g., the maximum curvature of the ego vehicle path before side slipping occurs, in radians), the inflection_point check includes max_inflection_points (e.g., the maximum number of times the path curvature changes sign to indicate "weaving") and curvature_epsilon (e.g., the sharpness of the turns, in radians), the clearance check includes min_clearance (e.g., the minimum allowed distance between the ego vehicle and another agent or object, in meters), the speed_bound includes min_speed, max_speed (e.g., the minimum and maximum speed of the ego vehicle, in meters/second) and the speed_extrema includes speed_change_epsilon (e.g., the number of times speed has a local minimum or maximum, measuring accelerations/decelerations). Note that some of these rules are safety related and others are comfort related. Referring to FIG. 13B, the example trajectory includes a timestamp, footprints, and initial pose (e.g., initial position), speed and acceleration for each agent in the scenario. The eight values for the footprint are the two-dimensional (2D) coordinates of the four corners of a rectangle that defines the ego footprint. In an embodiment, the 2D coordinates are local East North Up (ENU) coordinates, where the x-axis is East and the y-axis is North.

Figure 14A:
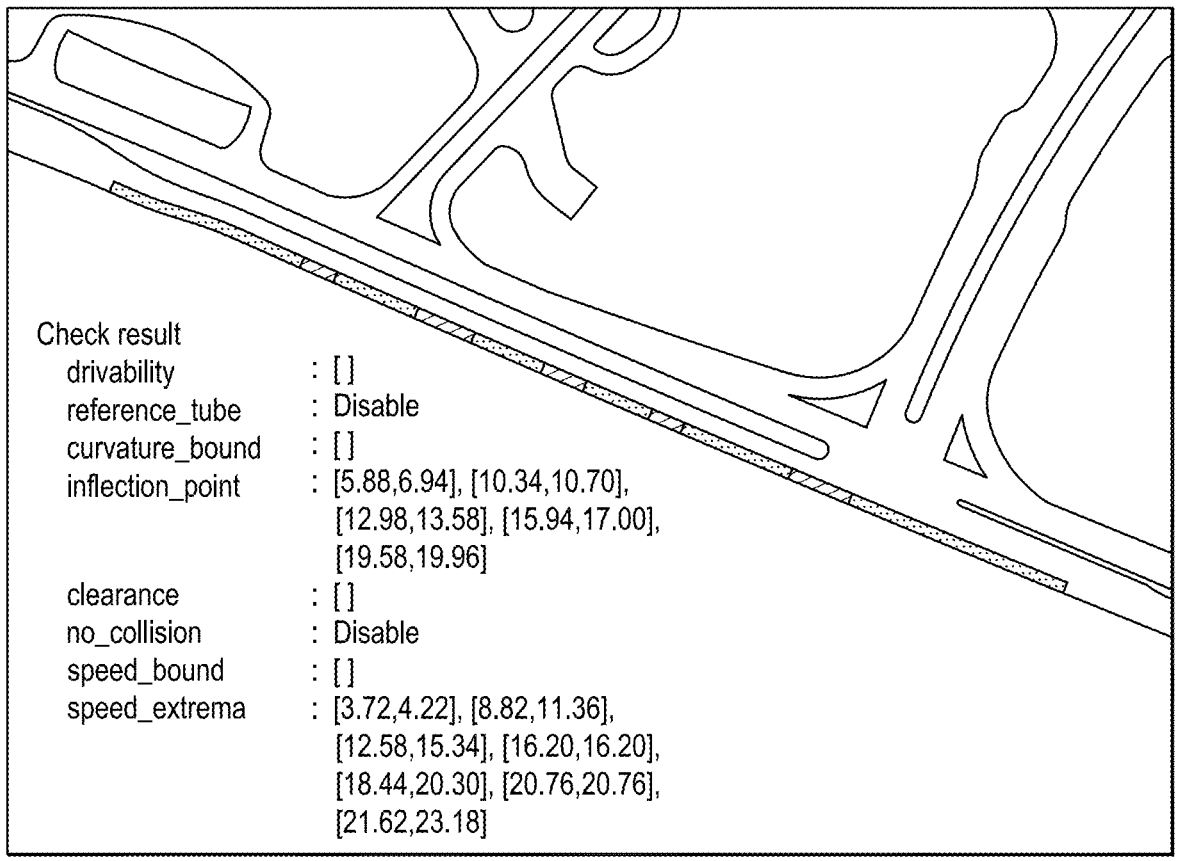
FIGS. 14A-14C illustrate rule-based evaluation of an example trajectory for speed extrema and inflection points, in accordance with one or more embodiments.
Figure 14B:
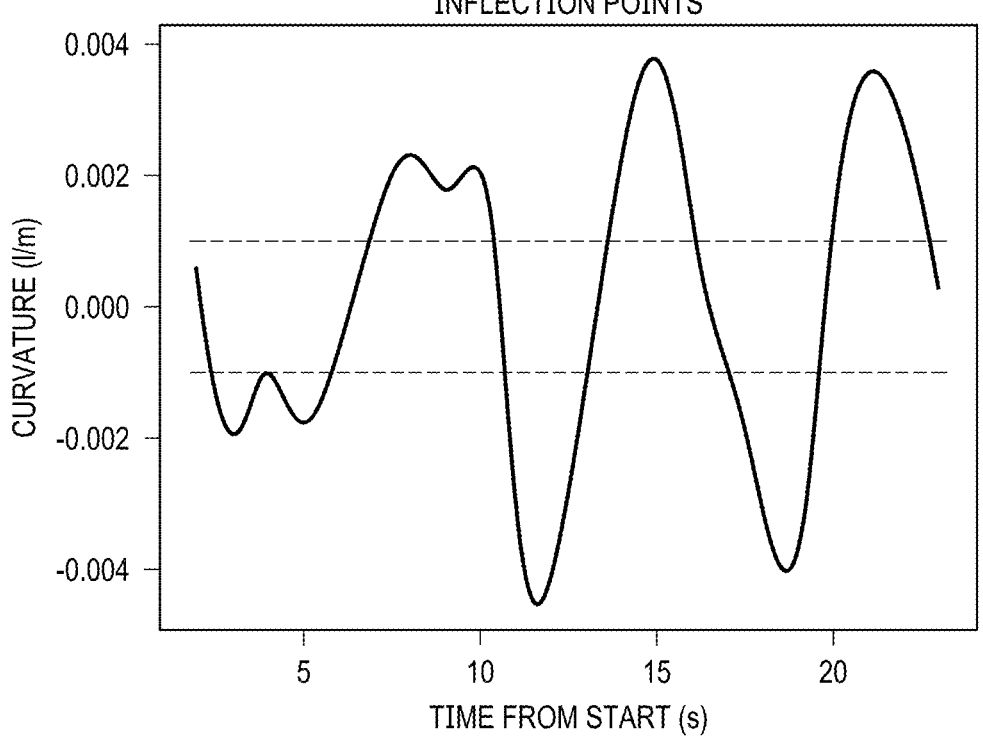
Figure 14C:
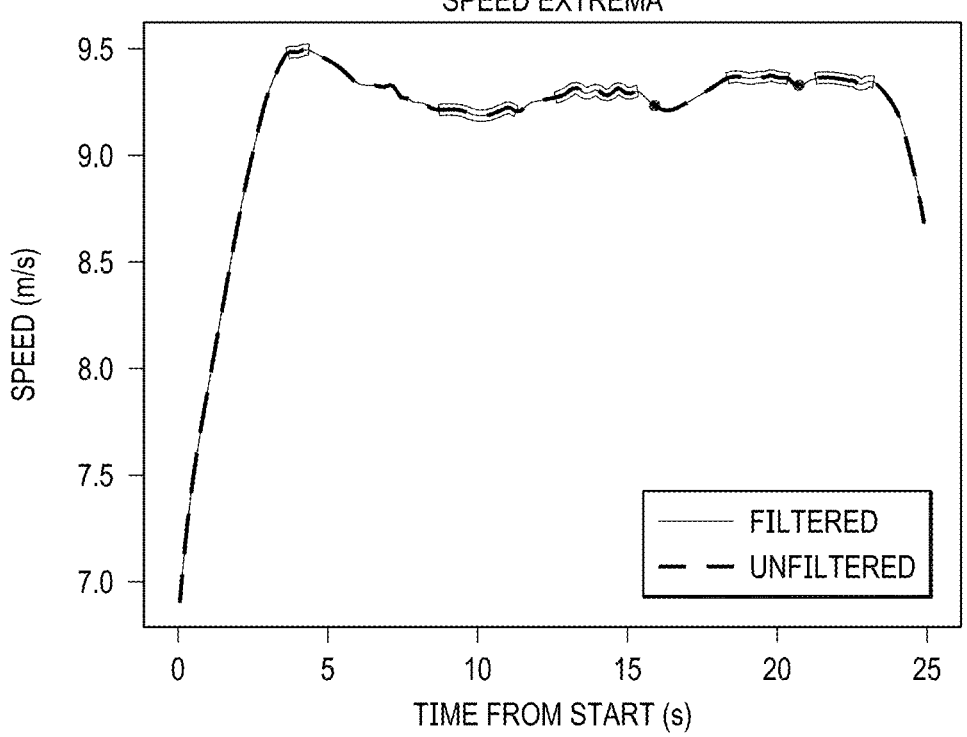

FIGS. 14A-14C illustrate rule-based evaluation of an example trajectory of an ego vehicle, in accordance with one or more embodiments. FIG. 14A shows a computer graphic of a road segment for the driving scenario and results for the checks. FIG. 14B is plot of curvature over time. FIG. 14C is a plot of the speed of the ego vehicle over time. The plots collectively show that the evaluated trajectory violates the inflection_point and speed_extrema rules at several occasions (5 times and 7 times respectively) in the example trajectory. In particular, FIG. 14A shows where, geographically, in the scenario the violations occurred, and FIGS. 14B and 14C show by how much the trajectory violates the acceptable values for each rule. The filtered plots are especially relevant for road logs, where vehicle sensors are noisy and might therefore register big spikes that do not reflect the actual curvature of the AV trajectory. The filtering remove some of that noise to only evaluate the actual AV trajectory, not the sensor noise. Note that road segments xxx have rule violations and road segments xxx do not have rule violations.

Figure 15A:
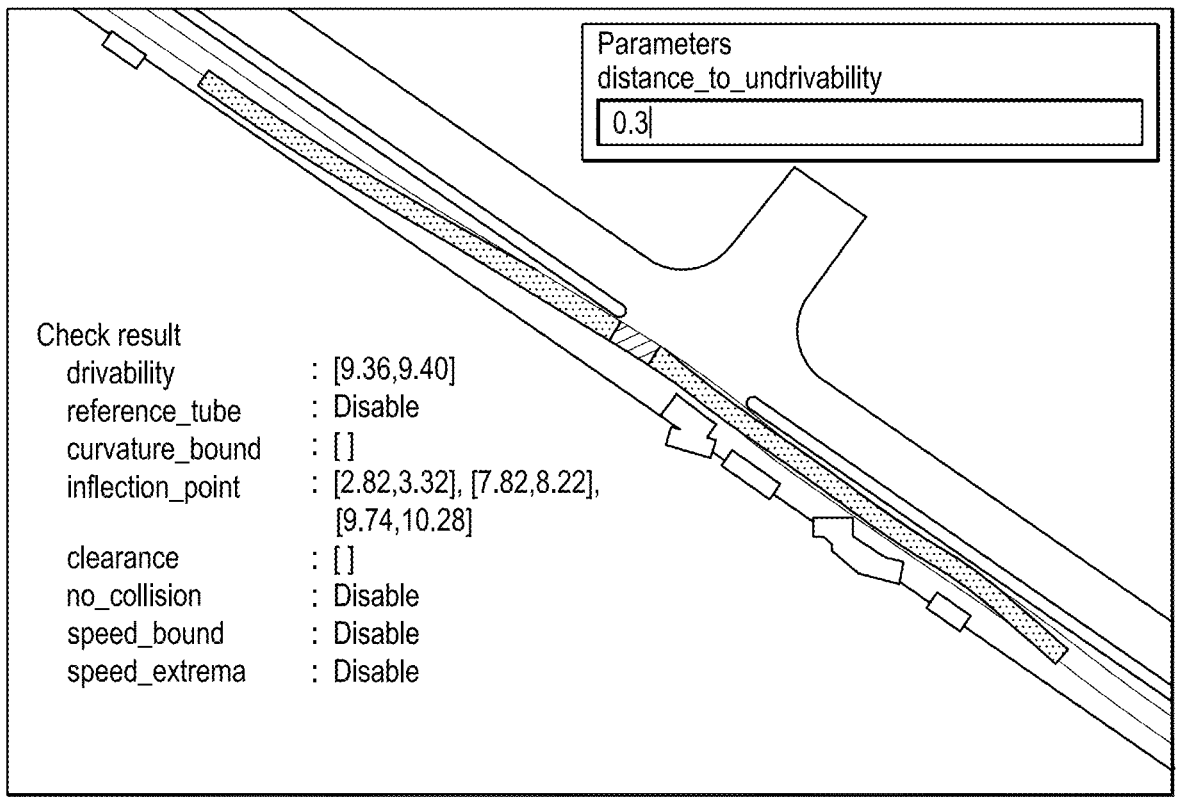
FIGS. 15A and 15B illustrate rule-based evaluation of an example trajectory for dangerous biasing, in accordance with one or more embodiments.
Figure 15B:
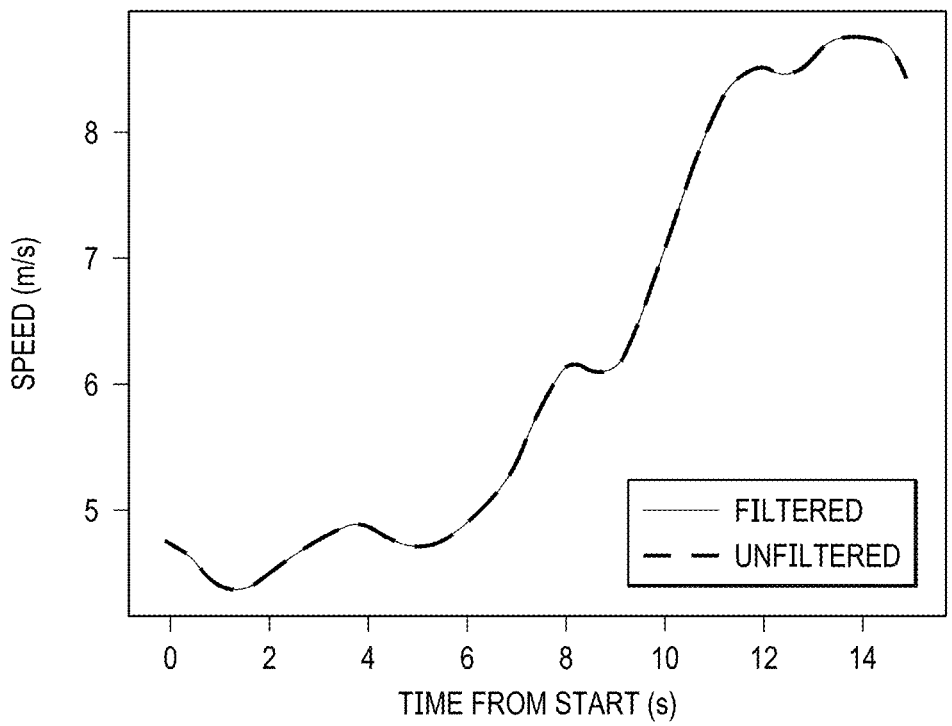

FIGS. 15A and 15B illustrate rule-based evaluation of another example trajectory of an ego vehicle, in accordance with one or more embodiments. FIG. 15A shows a computer graphic of a road segment for the driving scenario and the results for the checks. FIG. 15B is a plot of the speed of the ego vehicle over time. Based on FIG. 15B, the user would observe various dangerous biasing (e.g., the lateral distance between ego vehicle and parked cars is too small). For example, a trajectory that gets too close to other vehicles or object is dangerous. Thus, a safety rule would be to ensure that the ego vehicle stays a minimal distance from all agents and objects during any maneuvers, such as lane change, etc.

Figure 16A:
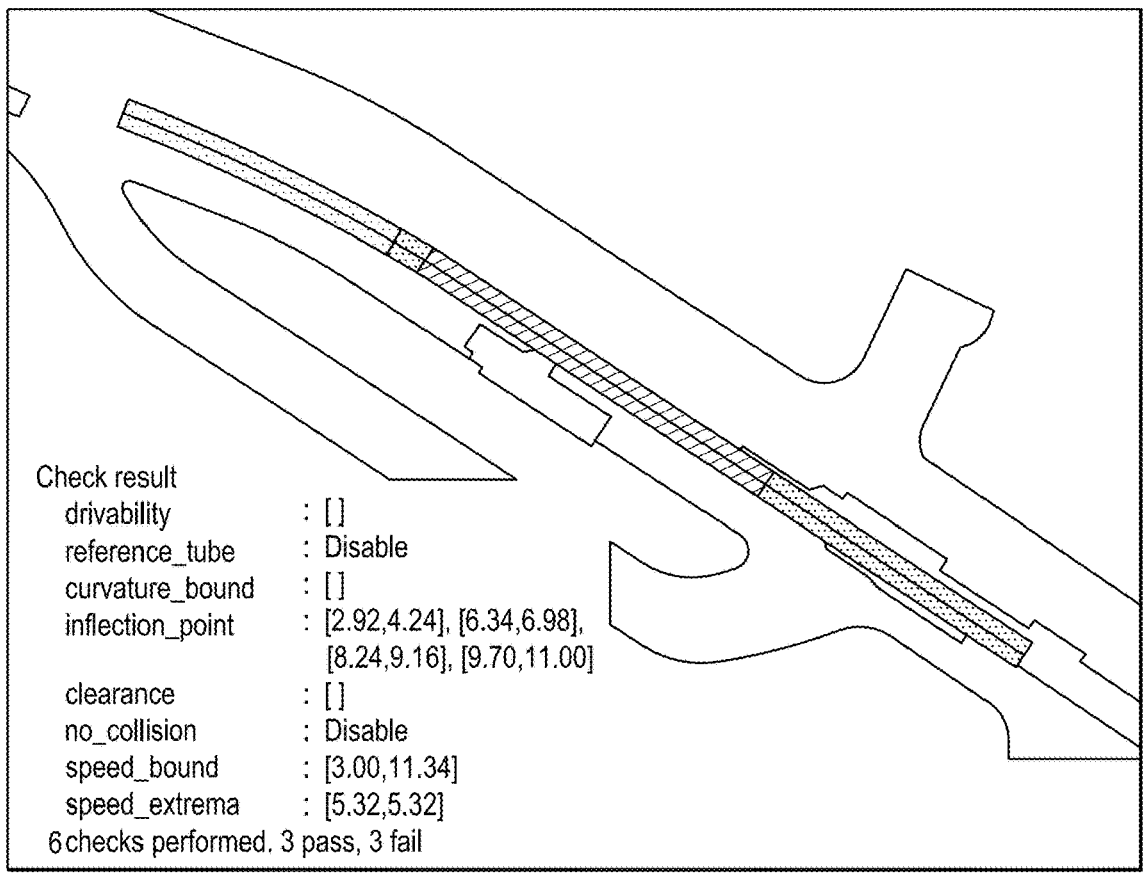
FIGS. 16A and 16B illustrate rule-based evaluation of an example trajectory for speed bounds when passing a parked car on the left, in accordance with one or more embodiments.
Figure 16B:
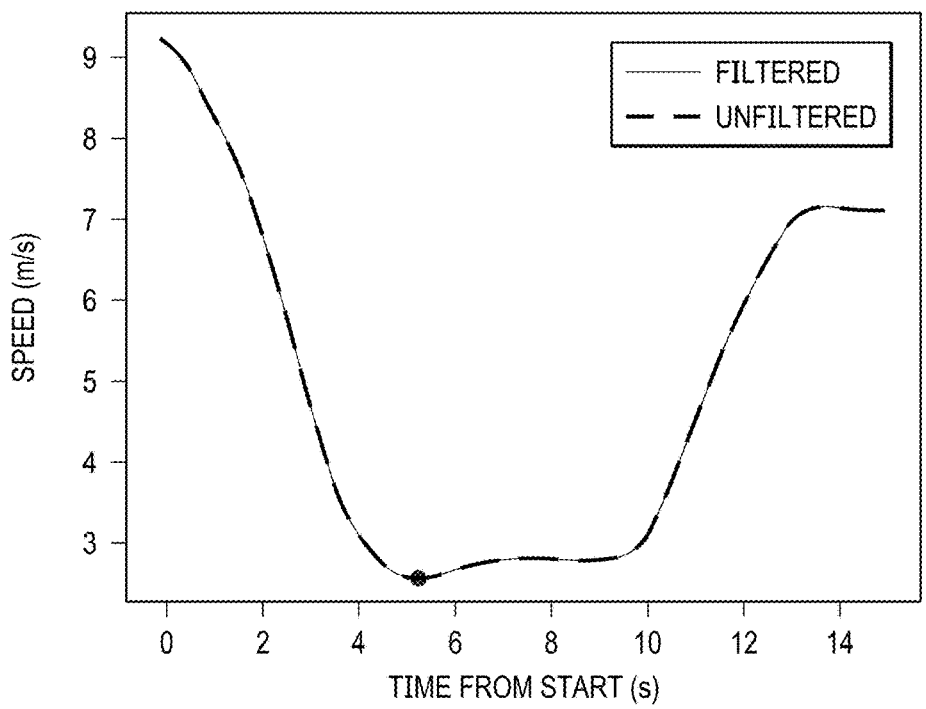

FIGS. 16A and 16B illustrate rule-based evaluation of another example trajectory of an ego vehicle that passes a parked car on the left, in accordance with one or more embodiments. FIG. 16A shows a computer graphic of road segment for the driving scenario and the results for the checks. FIG. 16B is a plot of the speed of the ego vehicle over time showing speed bounds. Based on this example result, the user would observe that the ego vehicle slows down a lot when passing a parked car on the left. For example, a trajectory where the ego vehicle slows down a lot when passing cars on the left may satisfy a safety rule but violate a destination goal rule. That is, a desirable behavior specification may be to slow down when passing a parked on the left side just enough to ensure the safety of the passengers and vehicles but not slower than that optimum speed.

Figure 17:
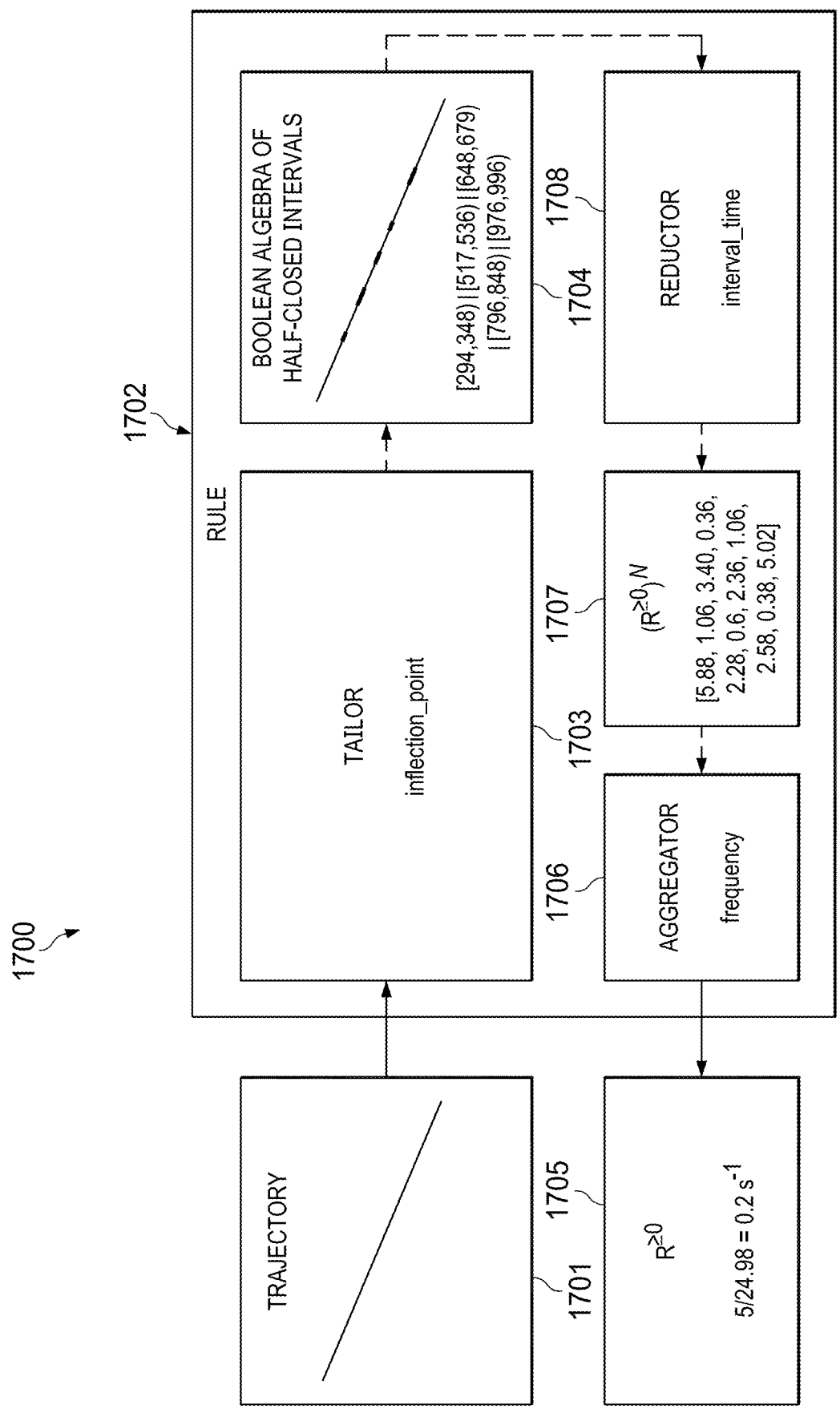
FIG. 17 illustrates measuring a degree of violation of a rule for multiple intervals, in accordance with one or more embodiments.

FIG. 17 illustrates an example evaluation of a trajectory by the rules-based trajectory evaluation system 500, in accordance with one or more embodiments. In this example, trajectory 1701 is processed by rule evaluator 1702. As previously described in reference to FIG. 7, tailor unit 1703 divides the trajectory into time intervals to focus on road segments that have inflection points. Reductor 1708 associates metrics 1707 to each of the time intervals, such as max_curvature and max_inflection_points. Aggregator 1706 aggregates the metrics 1707 to summarize a single score 1705 for trajectory 1701.

In an embodiment, a score is a real value that represents a trajectory's violation of a rule in a given scenario. There are different scoring options for tailors, reductors and aggregators. An example score is the violation of driving over the speed limit. At each point in time, the difference between ego speed ($v_{ego}$) and the speed limit ($v_{ego}^{lim}$) is computed. These values are squared and integrated over time. Finally, the square root is taken to determine the score. Examples of the instantaneous violation metric ($\rho_\phi$), the instance violation metric ($\rho_{T,\phi}$) and the total violation metric ($\rho_{total}$) for violation of driving over the speed limit are shown in Equations [1]-[3], respectively.

$$\rho_\phi(t)=\max(v_{ego}(t)-v_{ego}^{lim}(t),0)^2, \qquad [1]$$

$$\rho_{T,\phi}=\sqrt{\int_0^T \rho_\phi(t)dt}, \qquad [2]$$

$$\rho_{total}=\rho_{T,\phi}. \qquad [3]$$

Figure 18:
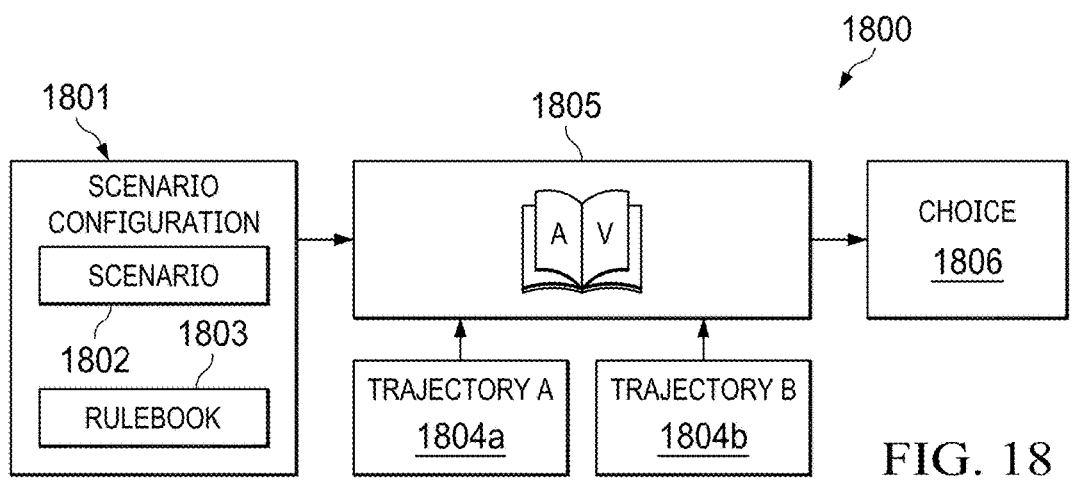
FIG. 18 illustrates using a rule-based trajectory evaluation system to compare two candidate trajectories and select one based on a number of rulebook violations, in accordance with one or more embodiments.

FIG. 18 illustrates using the rule-based trajectory evaluation system to compare two candidate trajectories and select one of the trajectories based on a number of rulebook violations, in accordance with one or more embodiments. Trajectories 1804a, 1804b generated for a particular scenario configuration 1801 are evaluated 1805 for violations of rules in rulebook(s) 1803. In an embodiment, the results of the evaluations (e.g., violation score of the most important violated rule, or a weighted sum of violations) are scores that can be compared to determine which trajectory has the least violation of the rulebook 1803, and the trajectory with the least violation is selected as the best trajectory for the ego vehicle to take for scenario 1803.

Figure 19:
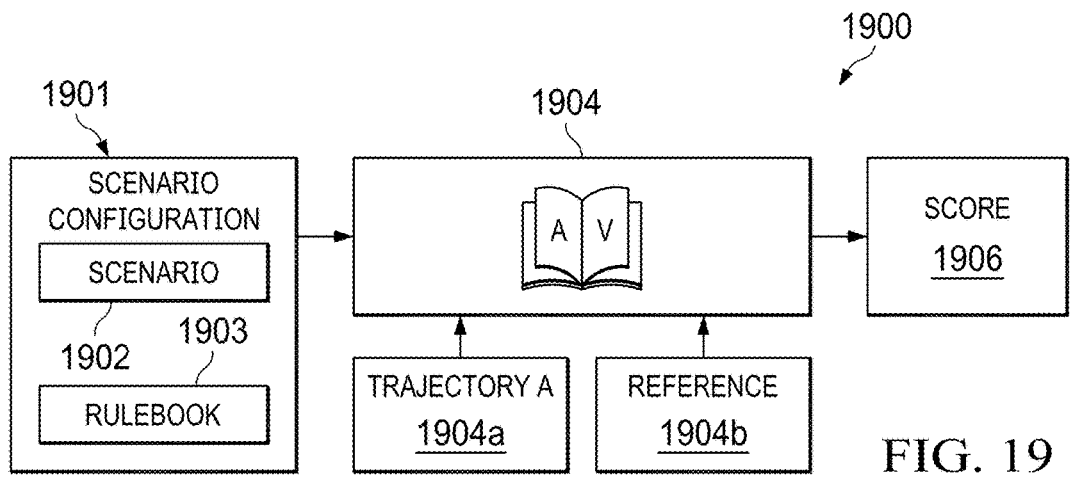
FIG. 19 illustrates using rule-based trajectory evaluation system to evaluate the behavior of the vehicle for a particular trajectory compared to a reference trajectory, in accordance with one or more embodiments.

FIG. 19 illustrates using the rule-based trajectory evaluation system to evaluate the behavior of the vehicle for a particular trajectory when compared to a reference trajectory, in accordance with one or more embodiments. Trajectory 1904a and reference trajectory 1904b are evaluated 1905 for violations of rulebook(s) 1903. Trajectories 1904a, 1904b are evaluated 1905 using rulebooks 1903 to determine how the trajectory 1904a compares with reference trajectory 1904b for the scenario 1902 (e.g., by comparing scores). The reference trajectory 1904b can be a directory that forces the ego vehicle to travel in the middle of the road, for example. Comparing the user selected trajectory 1904a with reference trajectory 1904b allows the user to evaluate the behavior of the ego vehicle scenario 1902 as compared to the behavior of the reference trajectory 1904b for scenario 1903.

Figure 20:
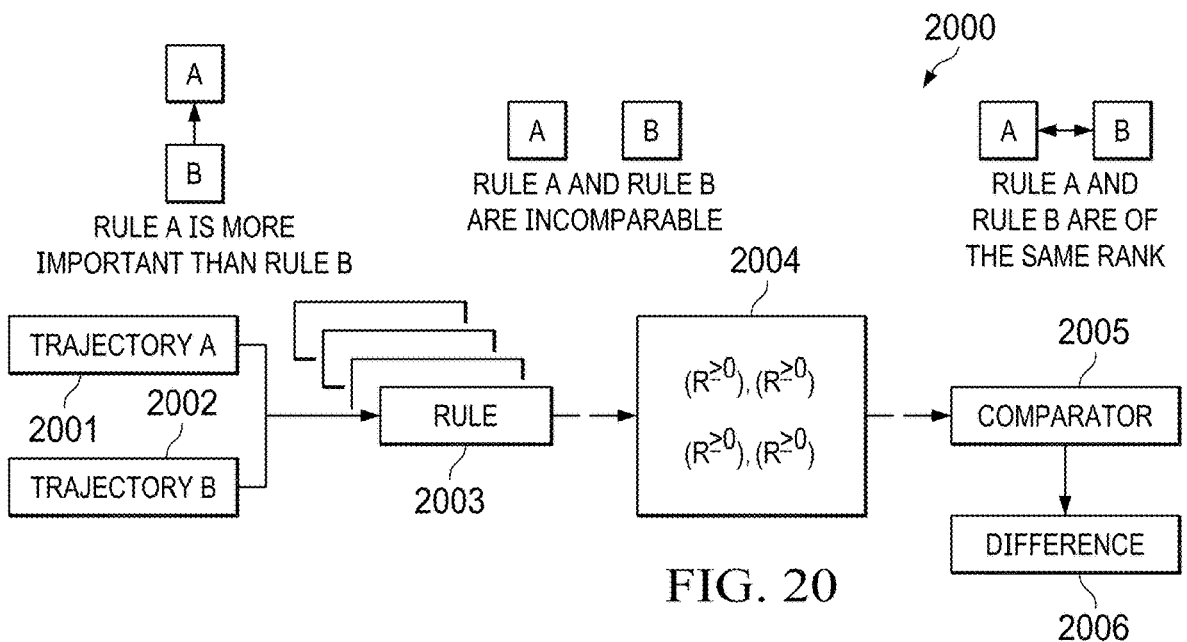
FIG. 20 illustrates use of a rulebook to evaluate and compare two trajectories, in accordance with one or more embodiments.

FIG. 20 illustrates the use of a rulebook, in accordance with one or more embodiments. The rulebook in FIG. 20 includes a pre-ordered set of rules arranged in a hierarchy of relative importance. Trajectories 2001, 2002 are evaluated using the rulebook to determine if the trajectories violate or satisfy rules A and B in the rulebook. In this example, rule A may be more important than rule B, and therefore rule A is at a higher level of the rulebook hierarchy. Rule A and rule B may be incomparable because they are not conflicting in any way. Rule A and rule B may have the same rank in the rulebook, i.e., the same level of the rulebook hierarchy. Each trajectory 2001, 2002 is evaluated by rulebook 2004 and the results (e.g., the number of rule violations and/or satisfactions) are compared 2005 to determine a difference 2006 in performance of the two trajectories 2001, 2002. In an embodiment, the comparison allows one trajectory to be selected over the other based on the number of rule violations. In an embodiment, evaluating a trajectory using the rulebook(s) results in a score for the trajectories 2001, 2002, which facilitates the comparing of the trajectories, i.e., the score is based on the number of rule violations or satisfactions. For example, if trajectory 2001 has a higher score than trajectory 2002, trajectory 2001 had less rule violations (or more rule satisfactions) than trajectory 2002. In an embodiment, the lower the score the less rule violations or satisfactions. In another embodiment, the violation of the highest rule in the priority structure violated by a trajectory, the more violation the trajectory has.

Figure 21:
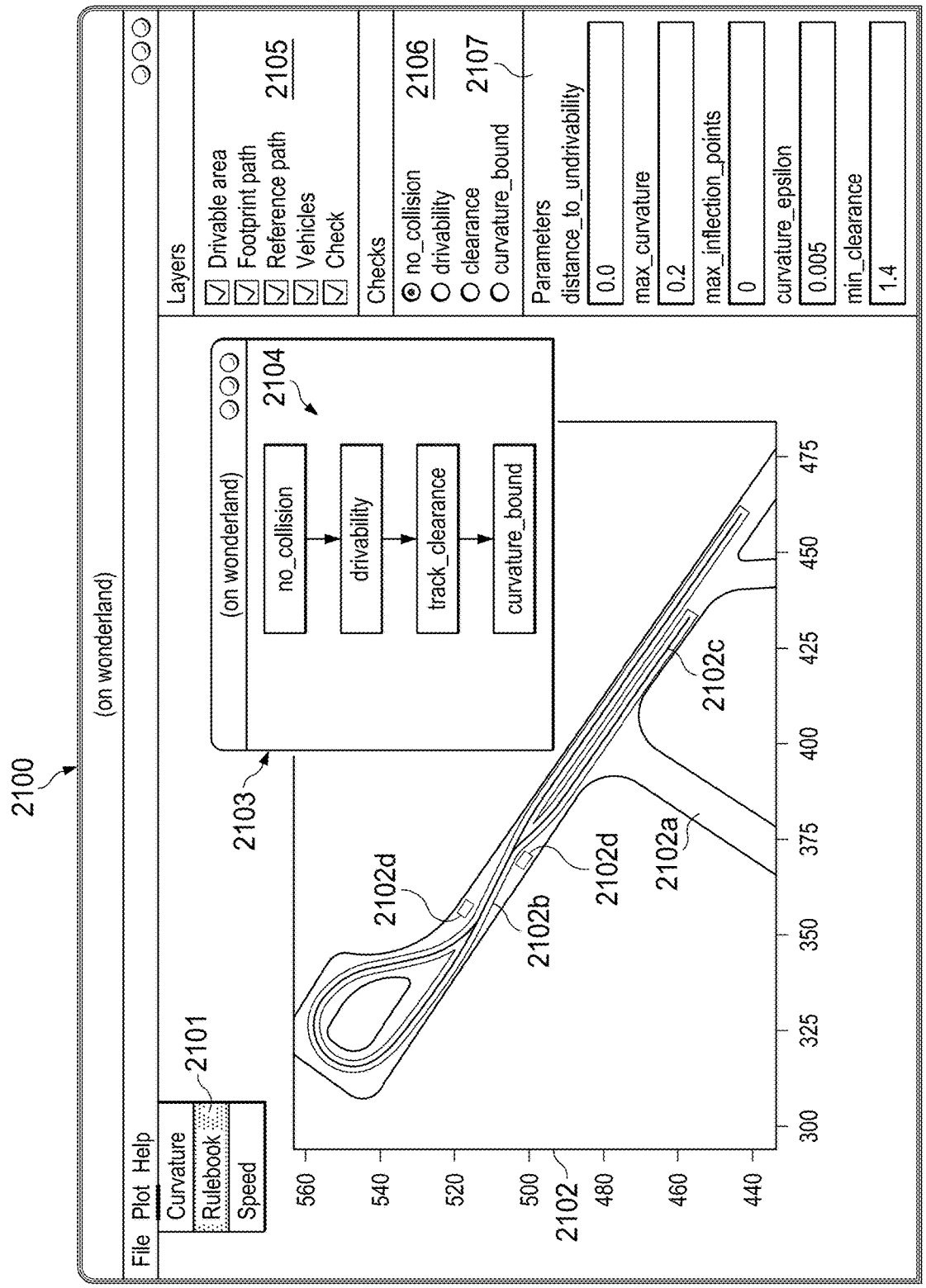
FIG. 21 illustrates a user interface of a rule-based trajectory evaluation system, in accordance with one or more embodiments.

FIG. 21 is an example screenshot of a graphical user interface (GUI) 2100 for rule evaluation, in accordance with one or more embodiments. GUI 2100 is an example of rule evaluation UI 501 shown in FIG. 5. GUI 2100 displays a bird's eye view (BEV) image 2102 of a road segment being evaluated. GUI affordance 2105 allows a user to select one or more layers to be overlaid on BEV image 2102, which, in this example, the user checked boxes for drivable area 2102a, footprint path 2102b, reference path 2102c, vehicles 2102d and check menu 2106. Check menu 2106 allows the user to select "checks" for the trajectory evaluation. In the example shown, the options for checks include no_collision, drivability, clearance and curvature_bound. The user has selected the "no_collision" check, which will cause the trajectory to be evaluated for collisions with other vehicles. GUI affordance 2107 provides a list of parameters for the selected check, which, in this example, includes distance_to_undrivability, max_curvature, max_inflection_points, curvature_epsilon and min_clearance. The user has selected values for curvature_epsilon and min_clearance. Accordingly, in this example, the user is testing a lane change maneuver to avoid a parked car and has specified a particular maximum curvature for the maneuver path and particular minimum lateral distance from the parked car.

A rule hierarchy 2104 is also displayed in GUI 2100 in response to the user selecting "Rulebook" option in menu 2101. The rule hierarchy 2104 shows the relative importance of the rules being applied to the trajectory. In this example, the rules are organized by importance from top to bottom where the most important rule is no_collision, followed by drivability, followed by track_clearance, followed by the least important rule of curvature_bound. The trajectory may violate the curvature_bound, track_clearance and drivability rules to ensure that the no_collision rule is enforced. This makes sense in that it is more desirable for the vehicle to drive off road and sacrifice the comfort of passengers (e.g., by making a quick avoidance maneuver or travel dangerously close to parked cars) to avoid a collision, which could result in serious injury or death.

EXAMPLE PROCESSES

Figure 22:
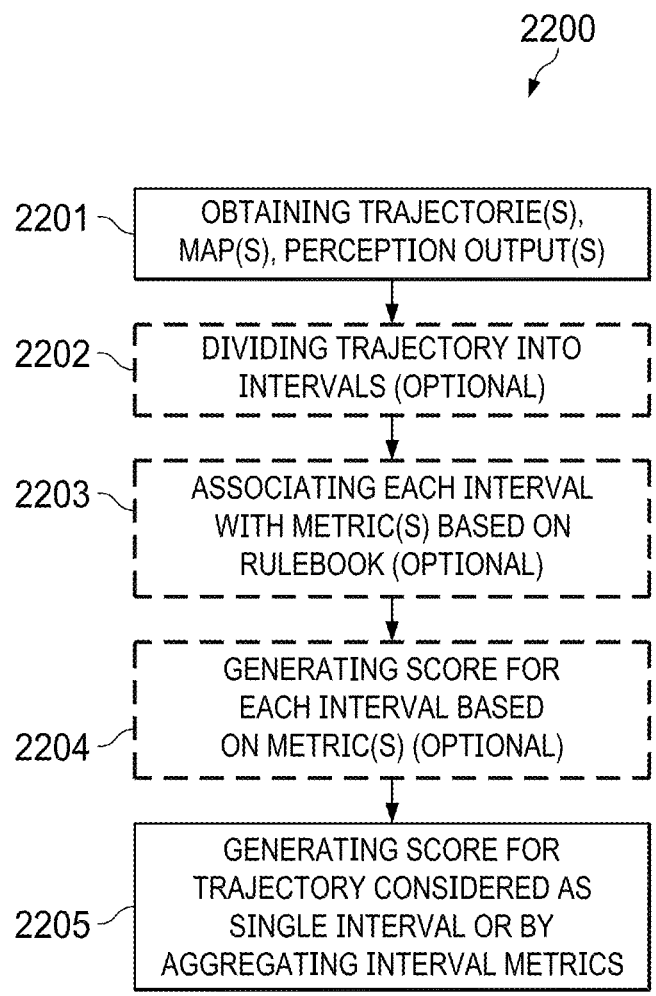
FIG. 22 is a flow diagram of a process for rule-based trajectory evaluation, in accordance with one or more embodiments.

FIG. 22 is a flow diagram of a process for rule-based trajectory evaluation, in accordance with one or more embodiments. Process 2200 can be implemented using, for example, computer system 300, as described in reference to FIG. 3.

Process 2200 can begin by obtaining one or more trajectories, maps and perception outputs (2201). For example, the trajectories, maps and perception outputs can be provided by software modules or other system using an API.

Process 2200 continues by optionally dividing the trajectory into time intervals (2202). For example, a trajectory can be divided into multiple intervals based on timestamps, and associating each time interval with one or more metrics of a rule (2203).

Process 2200 continues by generating a score for each time interval based on evaluation of the trajectory for that interval using the rulebook (2204). For example, an STL framework can be used to specify driving rules and an AGM framework can be used to score or measure the robustness of a trajectory. In other embodiments, other methods can be used to express system behavior under complex temporal requirements and to score trajectories.

Process 2200 continues by generating a score for the entire trajectory either considered as a single interval or by aggregating the metrics for all the time intervals (2205). The score can then be provided to human users or software modules, as previously described.

In the foregoing description, embodiments of the invention have been described with reference to numerous specific details that may vary from implementation to implementation. The description and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further including," in the foregoing description or following claims, what follows this phrase can be an additional step or entity, or a sub-step/sub-entity of a previously-recited step or entity.

What is claimed is:

1. A method comprising:
obtaining, using at least one processor, at least one trajectory associated with a driving scenario for an autonomous vehicle system;
evaluating, using the at least one processor and at least one rulebook, the at least one trajectory to determine whether the at least one trajectory violates at least one rule in the at least one rulebook, wherein each rule in the rulebook is associated with at least one violation metric that is used to determine a degree to which the rule was satisfied or violated;
determining, using the at least one processor and the at least one violation metric, a score for the at least one trajectory based on the degree to which the rule was satisfied or violated;
selecting a trajectory, using the at least one processor, from the at least one trajectory based on the score; and
controlling, using the at least one processor, the autonomous vehicle system to operate according to the selected trajectory in the driving scenario.

2. The method of claim 1, further comprising:
dividing, using the at least one processor, the at least one trajectory into a plurality of time intervals;
evaluating, using the at least one processor and the at least one rulebook, a portion of the at least one trajectory for the time interval to determine whether or by how much the portion violates the at least one rule in the at least one rulebook; and
aggregating, using the at least one processor, at least one value of the at least one violation metric for each time interval to generate an aggregated violation metric value based on determining that the portion violates the at least one rule in the at least one rulebook,
wherein determining the score for the at least one trajectory comprises:
determining the score for the at least one trajectory based on the aggregated violation metric value.

3. The method of claim 1, wherein the at least one rulebook is a data structure implementing a pre-ordered set of rules that are arranged in a hierarchy based on their relative importance.

4. The method of claim 1, wherein the rulebook includes a rule related to safety and another rule related to passenger comfort.

5. The method of claim 1, wherein the at least one trajectory includes at least two trajectories, and
wherein evaluating the at least one trajectory comprises:
evaluating each trajectory of the at least one trajectory using the at least one rulebook.

6. The method of claim 5, wherein one of the at least two trajectories is a reference trajectory against which another trajectory is compared.

7. The method of claim 1, wherein the evaluating uses qualitative and quantitative semantics to assess whether and how the at least one trajectory follows rules in the rulebook, and uses arithmetic and geometric means to account for degrees of robustness.

8. The method of claim 1, wherein the score indicates the number of rulebook violations, wherein the selected trajectory has the least number of rulebook violations.

9. A rule-based trajectory evaluation system, comprising:
a user interface configured for receiving user input selecting at least a driving scenario for an autonomous vehicle system;
at least one processor; and
a memory storing instructions thereon that, when executed by the at least one processor, cause the at least one processor to:
evaluate, using at least one rulebook, at least one trajectory in the at least one driving scenario to determine whether the at least one trajectory violates at least one rule in the at least one rulebook, wherein each rule in the rulebook is associated with at least one violation metric that is used to determine a degree to which the rule was satisfied or violated;
determine, using the at least one violation metric, a score for the at least one trajectory based on the degree to which the rule was satisfied or violated;
select a trajectory from the at least one trajectory based on the score; and
control the autonomous vehicle system to operate according to the selected trajectory in the driving scenario.

10. The system of claim 9, wherein the instructions further cause the at least one processor to:
- divide the at least one trajectory into a plurality of time intervals; and wherein the instructions that cause the at least one processor to evaluate the at least one trajectory further cause the at least one processor to:
- evaluate, using the at least one rulebook, a portion of the at least one trajectory for the time interval to determine a degree to which the portion violates the at least one rule in the at least one rulebook;
- aggregate at least one value of the at least one violation metric for each time interval; and
- determine, using the aggregated violation metrics, the score for the at least one trajectory.

11. The system of claim 9, further comprising a database storing the at least one rulebook as a data structure implementing a structured formulation of rules that are arranged in a hierarchy based on their relative importance.

12. The system of claim 9, wherein the at least one trajectory includes at least two trajectories,
- wherein the instructions that cause the at least one processor to evaluate the at least one trajectory cause the at least one processor to:
- evaluate each trajectory of the at least two trajectories using the at least one rulebook.

13. The system of claim 12, wherein one of the at least two trajectories is a reference trajectory against which another trajectory is compared.

14. A non-transitory, computer-readable storage medium having stored thereon instructions, that when executed by at least one processor, cause the at least one processor to perform operations comprising:
- obtaining, using the at least one processor, at least one trajectory associated with a driving scenario for an autonomous vehicle system;
- evaluating, using the at least one processor and at least one rulebook, the at least one trajectory to determine whether the at least one trajectory violates at least one rule in the at least one rulebook, wherein each rule in the rulebook is associated with at least one violation metric that is used to determine a degree to which the rule was satisfied or violated;
- determining, using the at least one processor and the at least one violation metric, a score for the at least one trajectory based on the degree to which the rule was satisfied or violated;
- selecting a trajectory, using the at least one processor, from the at least one trajectory based on the score; and
- controlling, using the at least one processor, the autonomous vehicle system to operate according to the selected trajectory in the driving scenario.

15. The computer-readable storage medium of claim 14, further comprising:
- dividing, using the at least one processor, the at least one trajectory into a plurality of time intervals;
- evaluating, using the at least one processor and the at least one rulebook, a portion of the at least one trajectory for the time interval to determine whether or by how much the portion violates the at least one rule in the at least one rulebook; and
- aggregating, using the at least one processor, at least one value of the at least one violation metric for each time interval to generate an aggregated violation metric value based on determining that the portion violates the at least one rule in the at least one rulebook,
- wherein determining the score for the at least one trajectory comprises:
- determining the score for the at least one trajectory based on the aggregated violation metric value.

16. The computer-readable storage medium of claim 14, wherein the at least one rulebook is a data structure implementing a pre-ordered set of rules that are arranged in a hierarchy based on their relative importance.

17. The computer-readable storage medium of claim 14, wherein at least one rule is related to safety and at least one rule is related to passenger comfort.

18. The computer-readable storage medium of claim 14, wherein the at least one trajectory includes at least two trajectories, and wherein evaluating the at least one trajectory comprises:
- evaluating each trajectory of the at least one trajectory using the at least one rulebook.

19. The computer-readable storage medium of claim 18, wherein one of the at least two trajectories is a reference trajectory against which another trajectory is compared.

* * * * *